(12) United States Patent
Yamazawa et al.

(10) Patent No.: US 7,527,016 B2
(45) Date of Patent: May 5, 2009

(54) PLASMA PROCESSING APPARATUS

(75) Inventors: Yohei Yamazawa, Nirasaki (JP); Manabu Iwata, Nirasaki (JP); Chishio Koshimizu, Nirasaki (JP); Fumihiko Higuchi, Beverly, MA (US); Akitaka Shimizu, Nirasaki (JP); Asao Yamashita, Hopewell Junction, NY (US); Nobuhiro Iwama, Nirasaki (JP); Tsutomu Higashiura, Nirasaki (JP); Dongsheng Zhang, Tokyo (JP); Michiko Nakaya, Nirasaki (JP); Norikazu Murakami, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 102 days.

(21) Appl. No.: 10/615,915

(22) Filed: Jul. 10, 2003

(65) Prior Publication Data
US 2004/0035365 A1    Feb. 26, 2004

Related U.S. Application Data

(60) Provisional application No. 60/396,730, filed on Jul. 19, 2002.

(30) Foreign Application Priority Data

Jul. 12, 2002  (JP) ............................. 2002-204928
Mar. 6, 2003  (JP) ............................. 2003-060670

(51) Int. Cl.
*C23C 16/00* (2006.01)
*C23F 1/00* (2006.01)
*H01L 21/306* (2006.01)
*H05B 31/26* (2006.01)

(52) U.S. Cl. ............................. 118/723 E; 156/345.43; 156/345.44; 156/345.47; 315/111.21

(58) Field of Classification Search ............ 156/345.44; 118/723 E
See application file for complete search history.

(56) References Cited

U.S. PATENT DOCUMENTS

| 4,340,461 | A | * | 7/1982 | Hendricks et al. ...... 204/298.33 |
| 5,272,417 | A | * | 12/1993 | Ohmi ..................... 315/111.21 |
| 5,474,648 | A | * | 12/1995 | Patrick et al. .................. 438/10 |

(Continued)

FOREIGN PATENT DOCUMENTS

JP    58-158929    9/1983

(Continued)

*Primary Examiner*—Parviz Hassanzadeh
*Assistant Examiner*—Rakesh K Dhingra
(74) *Attorney, Agent, or Firm*—Oblon, Spivak, McClelland, Maier & Neustadt, P.C.

(57) ABSTRACT

An apparatus, which performs a plasma process on a target substrate by using plasma, includes first and second electrodes in a process chamber to oppose each other. An RF field, which turns a process gas into plasma by excitation, is formed between the first and second electrodes. An RF power supply, which supplies RF power, is connected to the first or second electrode through a matching circuit. The matching circuit automatically performs input impedance matching relative to the RF power. A variable impedance setting section is connected to a predetermined member, which is electrically coupled with the plasma, through an interconnection. The impedance setting section sets a backward-direction impedance against an RF component input to the predetermined member from the plasma. A controller supplies a control signal concerning a preset value of the backward-direction impedance to the impedance setting section.

11 Claims, 17 Drawing Sheets

U.S. PATENT DOCUMENTS

| | | | |
|---|---|---|---|
| 5,815,047 A * | 9/1998 | Sorensen et al. | 333/17.3 |
| 5,849,372 A * | 12/1998 | Annaratone et al. | 427/569 |
| 6,174,450 B1 * | 1/2001 | Patrick et al. | 216/61 |
| 6,199,505 B1 * | 3/2001 | Sato et al. | 118/723 E |
| 6,252,354 B1 * | 6/2001 | Collins et al. | 315/111.51 |
| 6,270,618 B1 * | 8/2001 | Nakano et al. | 156/345.44 |
| 6,485,602 B2 * | 11/2002 | Hirose | 156/345.44 |
| 6,631,693 B2 * | 10/2003 | Hilliker | 118/723 E |
| 6,812,646 B2 * | 11/2004 | Windhorn et al. | 315/111.21 |
| 6,884,635 B2 * | 4/2005 | Parsons | 438/10 |
| 7,004,107 B1 * | 2/2006 | Raoux et al. | 118/723 E |
| 7,030,335 B2 * | 4/2006 | Hoffman et al. | 219/121.43 |
| 7,042,311 B1 * | 5/2006 | Hilliker et al. | 333/133 |
| 2001/0009139 A1 * | 7/2001 | Shan et al. | 118/723 E |
| 2002/0007915 A1 * | 1/2002 | Hirose | 156/345 |
| 2003/0192475 A1 * | 10/2003 | Shannon et al. | 118/715 |

FOREIGN PATENT DOCUMENTS

| | | |
|---|---|---|
| JP | 7-297175 | 11/1995 |
| JP | 11-185998 | 7/1999 |
| JP | 2000-286235 | 10/2000 |
| JP | 2002-343768 | 11/2002 |

* cited by examiner

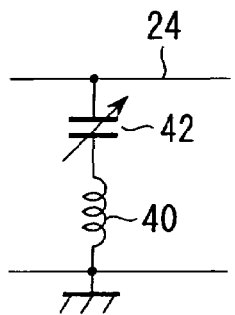 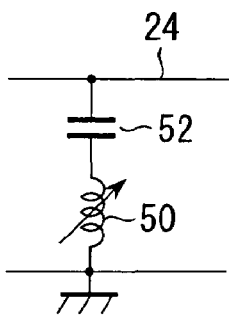 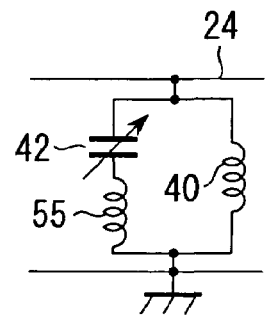 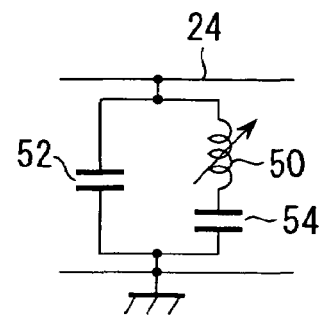
FIG. 7A    FIG. 7B    FIG. 7C    FIG. 7D
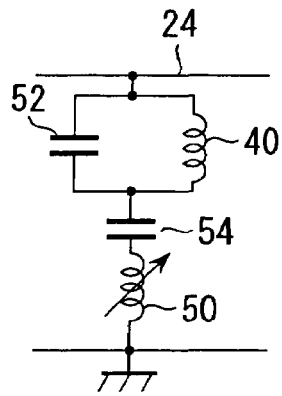 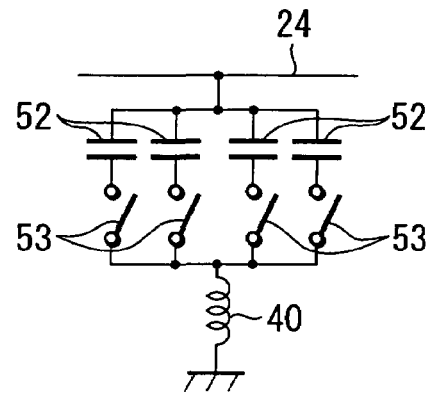 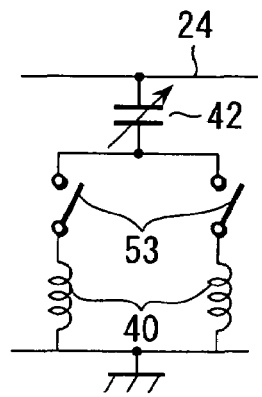
FIG. 7E    FIG. 7F    FIG. 7G
|  | Power to upper electrode | | | | |
|---|---|---|---|---|---|
|  | 100 | 200 | 300 | 400 | 500 |
| Power to lower electrode | | | | | |
| 30 | ○ | △ | △ | △ | △ |
| 45 | ○ | × | ○ | △ | ○ |
| 60 | ○ | △ | ○ | ○ | ○ |
| 75 | ○ | △ | ○ | ○ | ○ |
| 90 | ○ | △ | ○ | ○ | ○ |
| 105 | ○ | △ | ○ | ○ | ○ |
FIG. 8

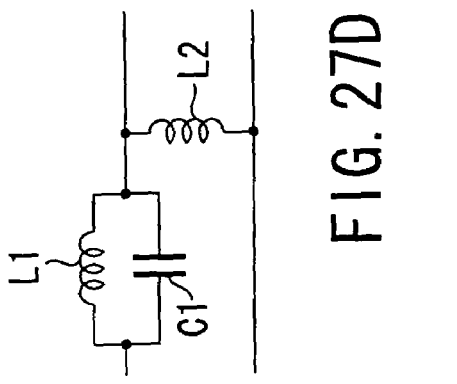
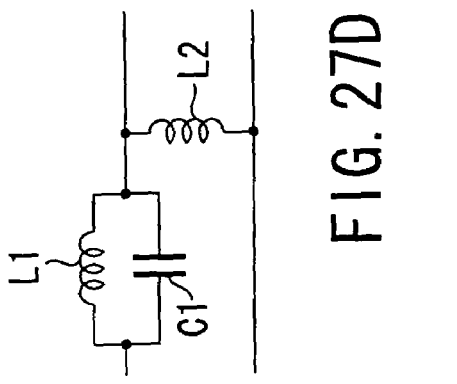
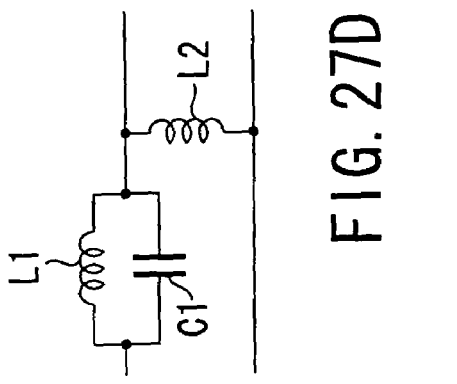
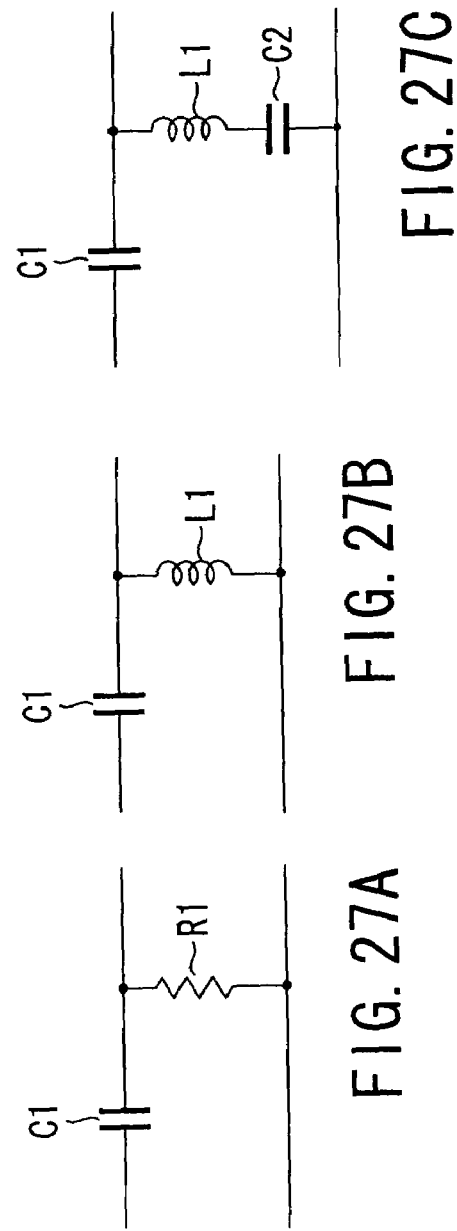
FIG. 27A  FIG. 27B  FIG. 27C  FIG. 27D
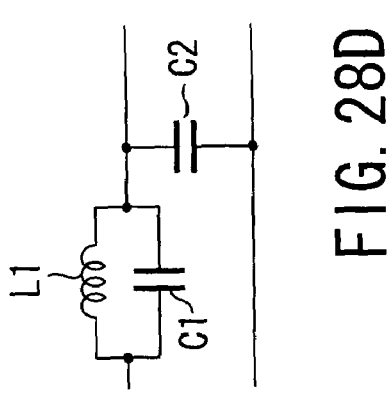
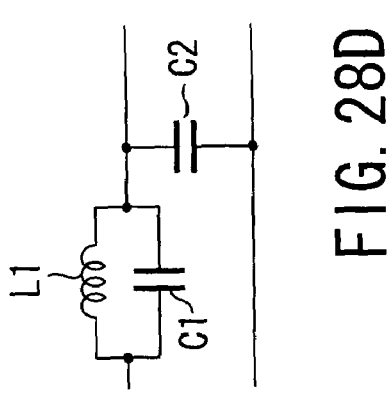
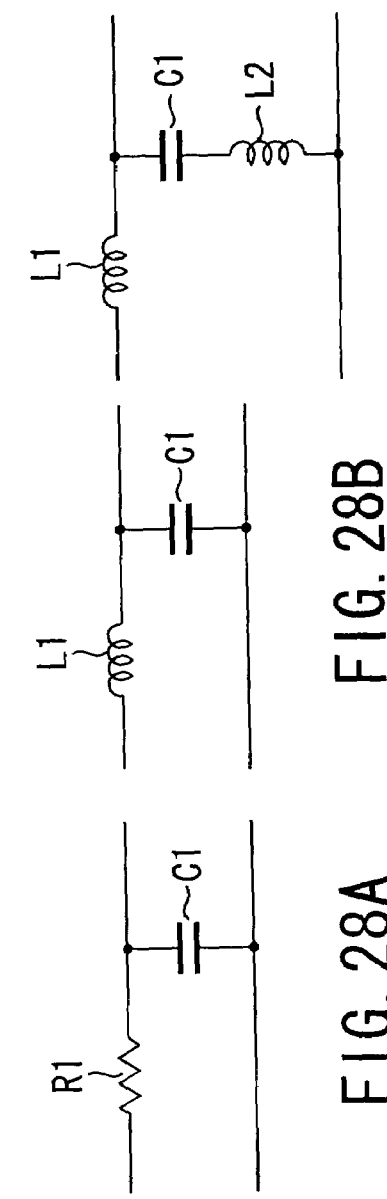
FIG. 28A  FIG. 28B  FIG. 28C  FIG. 28D

PLASMA PROCESSING APPARATUS

CROSS-REFERENCE TO RELATED APPLICATIONS

This application is based upon and claims the benefit of priority from the prior Japanese Patent Application No. 2002-204928, filed Jul. 12, 2002; the prior U.S. Provisional Patent Application Ser. No. 60/396,730, filed Jul. 19, 2002; and the prior Japanese Patent Application No. 2003-60670, filed Mar. 6, 2003, the entire contents of all of which are incorporated herein by reference.

BACKGROUND OF THE INVENTION

1. Field of the Invention

The present invention relates to an apparatus which performs a plasma process on a target substrate by using plasma in, e.g., a semiconductor processing system. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

2. Description of the Related Art

In general, in the manufacture of a semiconductor device, various processes, such as film formation, annealing, etching, oxidation and diffusion, and the like, are performed. Most of these processes are performed in a plasma processing apparatus using radio-frequency (RF) power.

For example, in a parallel-plate plasma processing apparatus, a semiconductor wafer is placed on a lower electrode also serving as a susceptor. RF power is applied across the lower electrode and an upper electrode opposing it, to generate plasma. Various processes, such as film formation and etching, are performed with the plasma.

To increase the yield of the products manufactured from a semiconductor wafer, the planar uniformity of the plasma process for the wafer must be maintained high. In this case, the plasma process uniformity for the semiconductor wafer largely depends on the state of the plasma generated in the process chamber. Hence, conventionally, to optimize the plasma state, the pressure or temperature in the process chamber during the process is adjusted. Also, the gas ratio of the various gases supplied into the process chamber is adjusted. Alternatively, the gap between the upper and lower electrodes is finely adjusted.

In the conventional apparatus, a structure that can adjust the gap between the upper and lower electrodes tends to be employed, because this structure is particularly effective in controlling the plasma state. For example, an elevating mechanism for vertically moving the lower electrode is provided at the bottom of the process chamber, so that the lower electrode can be moved vertically. The lower electrode is vertically moved when necessary by using the elevating mechanism, and the gap between the lower and upper electrodes is adjusted.

In the plasma processing apparatus as described above in which the electrode can be vertically moved, the plasma can be maintained in a good state regardless of the process conditions and the condition of the apparatus itself. However, for example, the lower electrode itself must be able to vertically move while maintaining the airtight state of the interior of the apparatus. Also, the elevating mechanism and a motor for vertically moving the lower electrode must be provided. Consequently, not only the apparatus size becomes large, but also the cost increases. As the size of the apparatus itself becomes large, the space needed to install the apparatus, i.e., the footprint, also increases undesirably.

BRIEF SUMMARY OF THE INVENTION

It is a first object of the present invention to provide a plasma processing apparatus in which the plasma state can be adjusted optimally, so that the planar uniformity of the plasma process can be maintained high with a simple structure.

It is a second object of the present invention to provide a plasma processing apparatus in which the plasma state in the process chamber can be maintained stably with a simple structure.

It is a third object of the present invention to provide a calibration method of performing calibration such that a machine difference (individual difference) concerning an impedance setting section used in a plasma processing apparatus is eliminated.

According to a first aspect of the invention, there is provided an apparatus which performs a plasma process on a target substrate by using plasma, comprising:

an airtight process chamber which accommodates the target substrate;

a gas supply system which supplies a process gas into the process chamber;

an exhaust system which exhausts an interior of the process chamber and sets the interior of the process chamber to a vacuum state;

first and second electrodes arranged in the process chamber to oppose each other, an RF field; which turns the process gas into plasma by excitation, being formed between the first and second electrodes;

an RF power supply which is connected to the first or second electrode through a matching circuit and which supplies RF power, the matching circuit serving to automatically perform input impedance matching relative to the RF power;

an impedance setting section which is connected, through an interconnection, to a predetermined member to be electrically coupled with the plasma in the plasma process, and which sets a backward-direction impedance as an impedance against an RF component input from the plasma to the predetermined member, the impedance setting section being capable of changing a value of the backward-direction impedance; and a controller which supplies a control signal concerning a preset value of the backward-direction impedance to the impedance setting section.

The term "backward direction" is used in the specification because the RF component described above flows in a direction electrically opposite to a direction in which a current flows from the RF power supply to the first or second electrode in the process chamber. Specifically, the direction in which a current flows from the RF power supply to the first or second electrode is defined as the forward direction, while the direction opposite thereto is defined as the backward direction.

According to a second aspect of the invention, there is provided an apparatus which performs a plasma process on a target substrate by using plasma, comprising:

an airtight process chamber which accommodates the target substrate;

a gas supply system which supplies a process gas into the process chamber;

an exhaust system which exhausts an interior of the process chamber and sets the interior of the process chamber to a vacuum state;

first and second electrodes arranged in the process chamber to oppose each other, an RF field, which turns the process gas into plasma by excitation, being formed between the first and second electrodes;

an RF power supply which is connected to the first or second electrode through a matching circuit and which supplies RF power, the matching circuit serving to automatically perform input impedance matching relative to the RF power;

an impedance setting section which is connected, through an interconnection, to a predetermined member to be electrically coupled with the plasma in the plasma process, and which sets a backward-direction impedance as an impedance against one of a plurality of different higher harmonics relative to a fundamental frequency of the RF power input from the plasma to the predetermined member, the impedance setting section being capable of changing a value of the backward-direction impedance; and a controller which supplies a control signal concerning a preset value of the backward-direction impedance to the impedance setting section.

According to a third aspect of the invention, there is provided an apparatus which performs a plasma process on a target substrate by using plasma, comprising:

an airtight process chamber which accommodates the target substrate;

a gas supply system which supplies a process gas into the process chamber;

an exhaust system which exhausts an interior of the process chamber and sets the interior of the process chamber to a vacuum state;

first and second electrodes arranged in the process chamber to oppose each other, an RF field, which turns the process gas into plasma by excitation, being formed between the first and second electrodes;

first and second interconnections which are respectively connected to the first and second electrodes and which extend to an outside of the process chamber, the first and second interconnections forming part of an AC circuit including electrical coupling between the first and second electrodes;

a first RF power supply which is arranged on the first interconnection and which supplies first RF power;

a first matching circuit which is arranged on the first interconnection between the first electrode and the first RF power supply and which automatically performs input impedance matching relative to the first RF power;

an impedance setting section which is arranged on the second intersection and which sets a backward-direction impedance as an impedance against an RF component input from the plasma to the second electrode, the impedance setting section being capable of changing a value of the backward-direction impedance, and the RF component including a component having a fundamental frequency of the first RF power; and a controller which supplies a control signal concerning a preset value of the backward-direction impedance to the impedance setting section.

According to a fourth aspect of the invention, there is provided an apparatus which performs a plasma process on a target substrate by using plasma, comprising:

an airtight process chamber which accommodates the target substrate;

a gas supply system which supplies a process gas into the process chamber;

an exhaust system which exhausts an interior of the process chamber and sets the interior of the process chamber to a vacuum state;

first and second electrodes arranged in the process chamber to oppose each other, an RF field, which turns the process gas into plasma by excitation, being formed between the first and second electrodes;

first and second interconnections which are respectively connected to the first and second electrodes and which extend to an outside of the process chamber, the first and second interconnections forming part of an AC circuit including electrical coupling between the first and second electrodes;

a first RF power supply which is arranged on the first interconnection and which supplies first RF power;

a first matching circuit which is arranged on the first interconnection between the first electrode and the first RF power supply and which automatically performs input impedance matching relative to the first RF power;

an impedance setting section which is arranged on the first intersection and which sets a backward-direction impedance as an impedance against an RF component input from the plasma to the first electrode, the impedance setting section being capable of changing a value of the backward-direction impedance, and the RF component including a harmonic of a fundamental frequency of the first RF power; and a controller which supplies a control signal concerning a preset value of the backward-direction impedance to the impedance setting section.

According to a fifth aspect of the invention, there is provided an apparatus which performs a plasma process on a target substrate by using plasma, comprising:

an airtight process chamber which accommodates the target substrate;

a gas supply system which supplies a process gas into the process chamber;

an exhaust system which exhausts an interior of the process chamber and sets the interior of the process chamber to a vacuum state;

first and second electrodes arranged in the process chamber to oppose each other, an RF field, which turns the process gas into plasma by excitation, being formed between the first and second electrodes;

first and second interconnections which are respectively connected to the first and second electrodes and which extend to an outside of the process chamber, the first and second interconnections forming part of an AC circuit including electrical coupling between the first and second electrodes;

a first RF power supply which is arranged on the first interconnection and which supplies first RF power;

a first matching circuit which is arranged on the first interconnection between the first electrode and the first RF power supply and which automatically performs input impedance matching relative to the first RF power;

an impedance setting section which is arranged on the first intersection and which sets a backward-direction impedance as an impedance against an RF component input to the first electrode;

a second RF power supply which is arranged on the second interconnection and which supplies second RF power, the second RF power supply being capable of changing a frequency of the second RF power;

a second matching circuit which is arranged on the second interconnection between the second electrode and the second RF power supply and which automatically performs input impedance matching relative to the second RF power; and a controller which supplies a control signal concerning a preset value of a frequency of the second RF power to the second RF power supply.

According to a sixth aspect of the invention, there is provided a calibration method for the impedance setting section in the apparatus according to the first aspect, the method comprising steps of:

obtaining, by measurement, calibration data that compensates for a difference in setting the backward-direction impedance which is intrinsic to the impedance setting section; and adjusting the preset value with the calibration data and then adjusting the backward-direction impedance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 7A to 7G are circuit diagrams showing modifications of the impedance setting section in the apparatus shown in FIG. 1;

FIG. 8 is a diagram showing plasma stability in the apparatus shown in FIG. 1 which is obtained when the combination of RF powers to be applied to the upper and lower electrodes is changed;

FIGS. 27A to 27D are circuit diagrams showing examples of a high-pass filter;

FIGS. 28A to 28D are circuit diagrams showing examples of a low-pass filter;

DETAILED DESCRIPTION OF THE INVENTION

Figure 1:
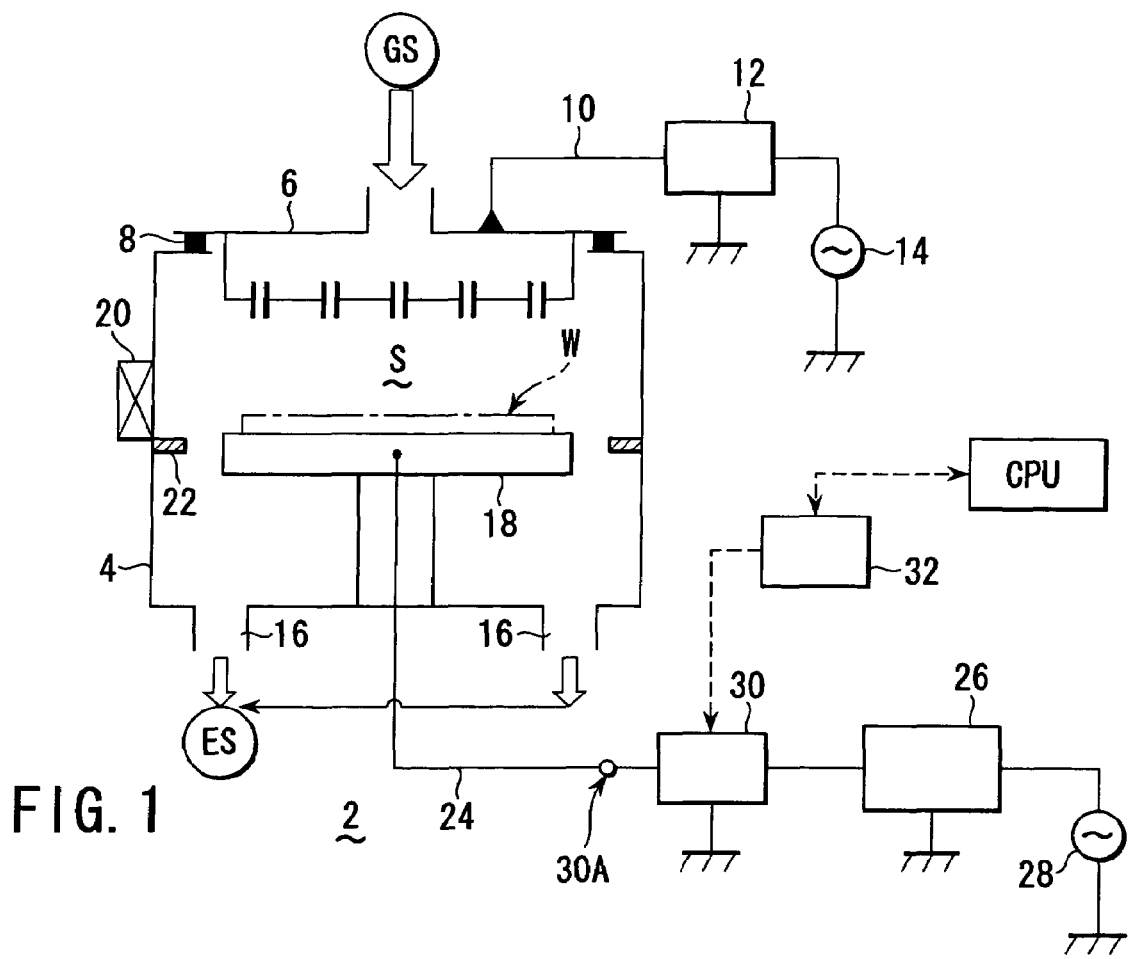
FIG. 1 is a schematic diagram showing the arrangement of a plasma processing apparatus according to a first embodiment of the present invention.

Embodiments of the present invention will be described with reference to the accompanying drawings. In the following description, the constituent elements having substantially the same function and arrangement are denoted by the same reference numeral, and a repetitive description will be made only when necessary.

First Embodiment

FIG. 1 is a schematic diagram showing the arrangement of a plasma processing apparatus according to the first embodiment of the present invention. As shown in FIG. 1, a plasma processing apparatus 2 has an airtight cylindrical process chamber 4. The process chamber 4 is made of, e.g., aluminum, and can be vacuum-exhausted. The process chamber 4 is grounded. An upper electrode 6 made of, e.g., aluminum, is attached and fixed to the ceiling of the process chamber 4 through an insulating member 8. The upper electrode 6 forms a showerhead structure connected to a gas supply unit GS. The showerhead structure 6 introduces various gases, e.g., process gases, necessary for the process into the process chamber 4.

The upper electrode 6 is connected to an RF line 10. The RF line 10 is connected to a first RF power supply 14 for plasma generation through a first matching circuit 12 midway along it. The first RF power supply 14 applies RF power of, e.g., 60 MHz, to the upper electrode 6. The first matching circuit 12 has an automatic matching function so that the input impedance becomes, e.g., 50Ω so as to prevent the RF power supplied from the first RF power supply 14 to the upper electrode 6 from being reflected by the upper electrode 6.

The process chamber 4 has, in its bottom, exhaust ports 16 to be connected to a vacuum exhaust unit ES including a vacuum pump or the like. The vacuum exhaust unit ES exhausts the interior of the process chamber 4 and sets it in vacuum. A lower electrode 18 is arranged on a support column standing vertically from the bottom of the process chamber 4 to oppose the upper electrode 6. The lower electrode 18 is insulated. The lower electrode 18 is made of, e.g., aluminum, and also functions as a susceptor. For example, a semiconductor wafer W is placed as a target substrate on the upper surface of the lower electrode 18.

A gate 20 which is opened/closed when loading/unloading the wafer W is disposed on the sidewall of the process chamber 4. A rectifying plate 22 for rectifying the exhaust gas is disposed to surround the lower electrode 18. The rectifying plate 22 is supported by the sidewall of the process chamber 4. With the rectifying plate 22, the atmosphere which is being exhausted downward flows down uniformly from the lower electrode 18. A focus ring (not shown) made of, e.g., quartz or a ceramic material, is disposed around the upper surface of the lower electrode 18. The focus ring focuses the plasma onto the surface of the wafer W.

The lower electrode 18 is connected to an RF line 24. The RF line 24 is connected to a second RF power supply 28 for bias through a second matching circuit 26. The second RF power supply 28 for bias generates RF power with a frequency of, e.g., 13.56 MHz. This frequency is lower than the frequency of the first RF power supply 14.

The RF lines 10 and 24 and the first and second RF power supplies 14 and 28 form an AC circuit. This AC circuit includes electrical coupling between the upper and lower electrodes 6 and 18. The RF power applied from the first RF power supply 14 to the upper electrode 6 is mainly used for forming an RF field in a process space S between the lower and upper electrodes 18 and 6. The RF field turns the process gas into plasma. The RF power applied from the second RF power supply 28 to the lower electrode 18 is mainly used for attracting ions in the plasma to the surface of the wafer W. There is a case where the second RF power supply 28 also generates plasma.

An impedance setting section 30 is arranged in the RF line 24 between the second matching circuit 26 and lower electrode 18. The impedance setting section 30 changes the impedance seen from the upper electrode 6 side. In other words, the impedance setting section 30 sets a backward-direction impedance, which is an impedance against an RF component input from the plasma to the lower electrode 18 due to the 60-MHz power supplied from the first RF power supply 14 to the upper electrode 6. The backward-direction impedance of the impedance setting section 30 is adjusted by an impedance controller 32, e.g., a microcomputer. Thus, the impedance setting section 30 is controlled appropriately.

Figure 2:
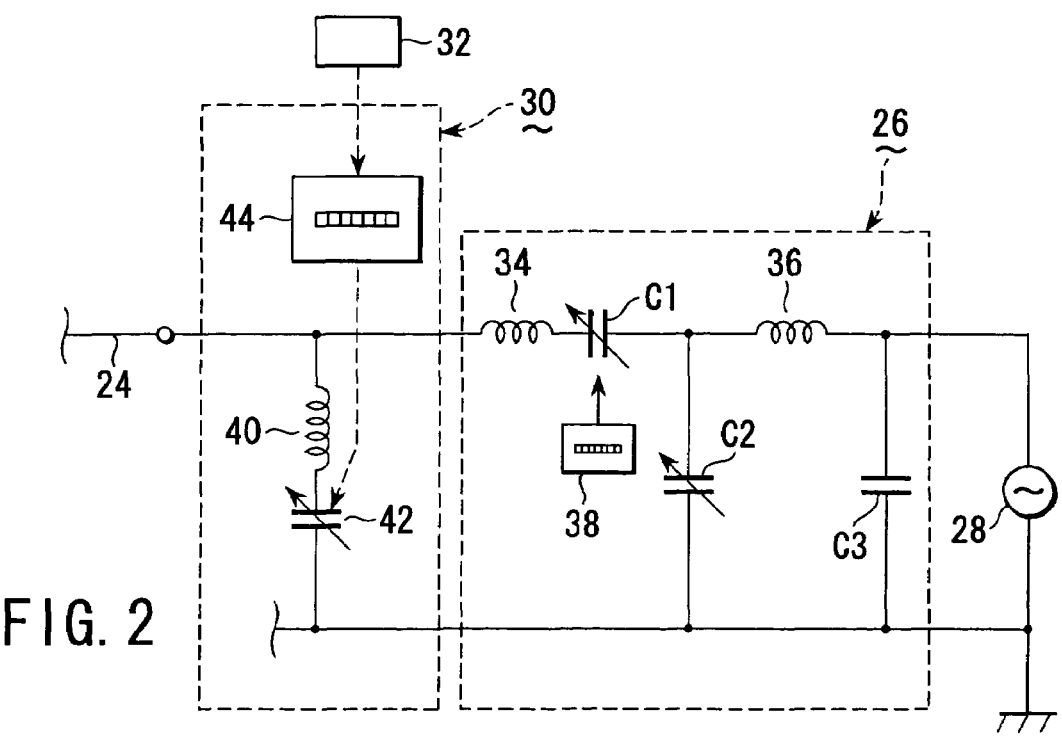
FIG. 2 is a circuit diagram showing a matching circuit and impedance setting section connected to a lower electrode in the apparatus shown in FIG. 1.

More specifically, as shown in FIG. 2, the second matching circuit 26 has a first fixed coil 34, first variable capacitor C1, and second fixed coil 36. These components are connected in series on the RF line 24 from the lower electrode 18 (see FIG. 1) side toward the second RF power supply 28 in this order.

A second variable capacitor C2 and fixed capacitor C3 are connected in parallel to each other between the two terminals of the second fixed coil 36 and ground. The second matching circuit 26 has an automatic matching function so that the input impedance becomes, e.g., 50Ω so as to prevent reflection of the RF power, supplied from the second RF power supply 28 to the lower electrode 18, from returning into the second RF power supply 28 (in the same manner as in the first matching circuit 12 described above). At this time, the adjustment position (corresponding to the capacity) of the first variable capacitor C1 which changes automatically can be checked with a position sensor 38. The current of the first RF power supply 14 supplied from the upper electrode 6 flows to ground through the sidewall of the process chamber 4, the lower electrode 18, and the like. Conversely, the current of the second RF power supply 28 supplied from the lower electrode 18 flows to ground through the sidewall of the process chamber 4, the upper electrode 6, and the like.

The impedance setting section 30 has a fixed coil 40 and variable capacitor 42 connected in series between the RF line 24 and ground. For example, the fixed coil 40 has an inductance of substantially 200 nH. The impedance of the lower electrode 18 side seen from the upper electrode 6 applied with 60-MHz power is set by changing the capacitance of the variable capacitor 42. At this time, the capacitance value of the variable capacitor 42 is automatically changed by an adjusting member 44 connected to it. The dial adjustment value (to be referred to as dial value hereinafter) representing the impedance set value at this time is displayed by the adjusting member 44 or the like. At this time, the value of the impedance itself may also be displayed simultaneously. An impedance is input as a dial value from the impedance controller 32 to the adjusting member 44. The impedance is instructed based on a recipe defining the process conditions or the like for processing the wafer. In place of or together with the function of displaying the impedance set value or dial value, the adjusting member 44 may have a function of transmitting (outputting) information to a host controller.

The inductance of the fixed coil 40 and the capacitance (including a variable range) of the variable capacitor 42 of the impedance setting section 30 are set to provide such an impedance against the frequency of 13.56 MHz of the second RF power supply 28, that is at least twice larger than the load impedance formed by the process chamber 4 and the plasma generated in it. Consequently, even when the inductance of the impedance of the impedance setting section 30 changes, it hardly adversely affects the matching operation of the second matching circuit 26. Also, this can prevent power loss of the RF power as the result of the presence of the impedance setting section and burn loss of the impedance setting section accompanying it.

Figure 3:
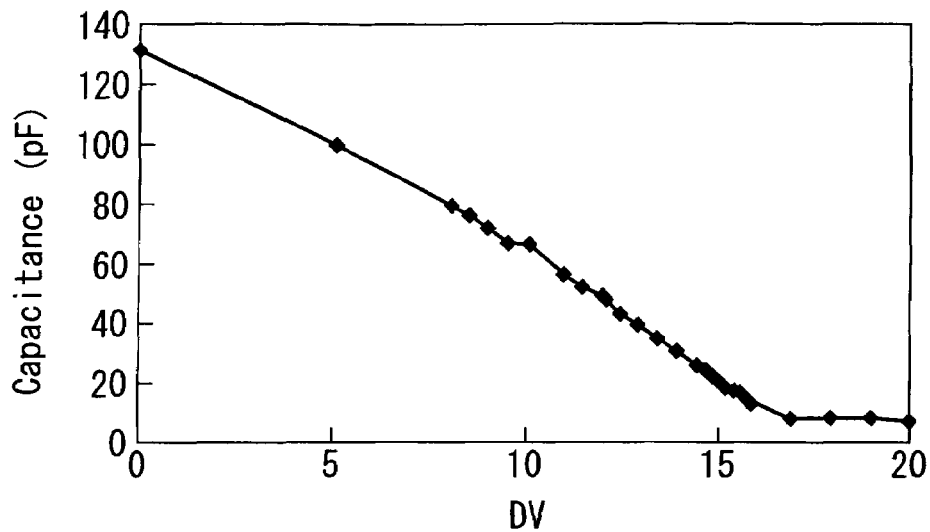
FIG. 3 is a graph showing the correlation between the adjustment value (dial value) and capacitance of the impedance setting section in the apparatus shown in FIG. 1.

FIG. 3 shows an example of the correlation between a dial value DV of the adjusting member 44 and the capacitance of the variable capacitor 42. When the dial value DV is 0 to 20, the capacitance can change substantially linearly within the range of about 5 pF to 130 pF. The impedance setting section 30 is set such that the larger the dial value DV, the smaller the capacitance.

Figure 4:
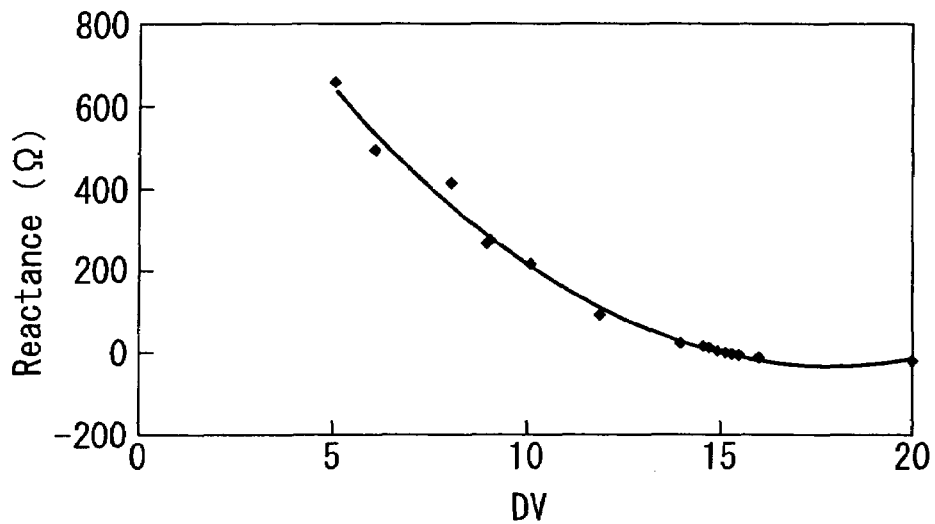
FIG. 4 is a graph showing the correlation between the adjustment value (dial value) and reactance of the impedance setting section in the apparatus shown in FIG. 1.

FIG. 4 shows the correlation between the dial value DV of the adjusting member 44 and the reactance of the impedance setting section against 60 MHz applied to the upper electrode 6. As is apparent from FIG. 4, the reactance can be controlled within the range of $-30\Omega$ to $+600\Omega$ by changing the dial value DV within the range of 5 to 20.

The operation of this embodiment having the above arrangement will be described.

As an example of the plasma process, a case will be described wherein a gate electrode is formed by etching a polysilicon film formed on an underlying layer formed of a silicon dioxide film. A process A with a high etching rate and an overetching process B with a low etching rate are performed continuously in one plasma processing apparatus. Of the two process steps, etching with a high anisotropy is performed in the process A in order to make the shape, and etching with a very high selectivity with respect to the underlying layer is performed in the process B.

The processes A and B use different conditions from each other, e.g., the gas ratio of the supply amounts of a plurality of gases to be supplied, the supply power, and the process pressure. Accordingly, the state of the plasma generated in the process space S changes. At this time, the impedance setting section 30 is controlled to maintain the planar uniformity of the plasma process.

The optimal impedance set values of the impedance setting section 30 for the processes A and B are experimentally obtained in advance. When performing the processes A and B, each impedance set value is input as a dial value from a main controller CPU to the impedance setting section 30 through the impedance controller 32. The main controller CPU controls the entire operation of the plasma processing apparatus 2. The impedance setting section 30 automatically changes the capacitance of the variable capacitor 42 to correspond to the dial value. Consequently, the impedance is adjusted to an optimal value.

Examples of the process conditions for the processes A and B are as follows:

| <Process A> | |
|---|---|
| Process gas (etching gas): | $HBr/O_2$ = 400/1 sccm |
| Process pressure: | 2.7 Pa (20 mTorr) |
| Lower electrode temperature: | 75° C. |
| RF power: | upper electrode/lower electrode = 200/100 W (watt) |
| <Process B> | |
| Process gas (etching gas): | $HBr/O_2$ = 1,000/4 sccm |
| Process pressure: | 20 Pa (150 mTorr) |
| Lower electrode temperature: | 75° C. |
| RF power: | upper electrode/lower electrode = 650/200 W (watt) |

Figure 5:
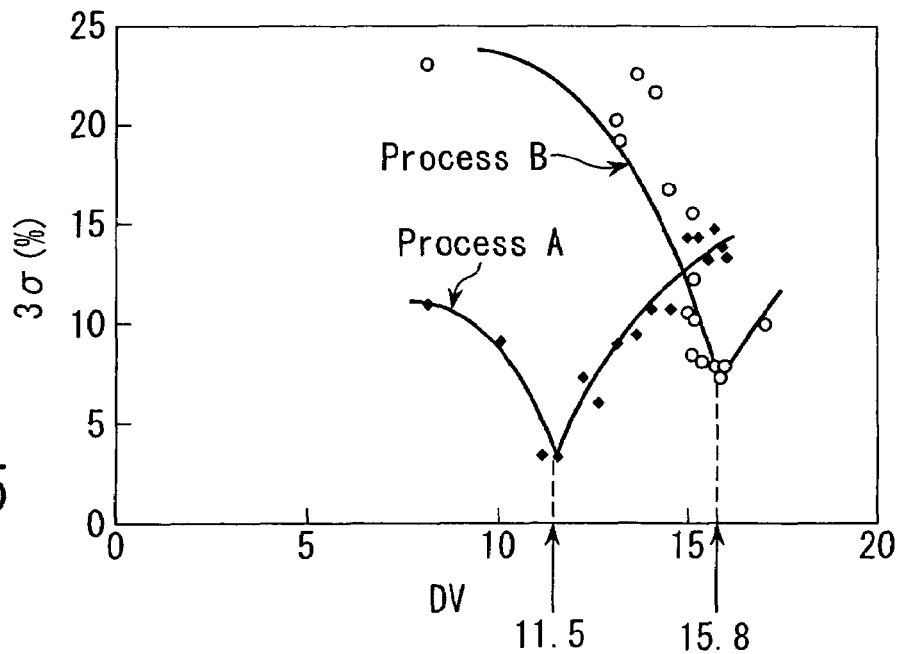
FIG. 5 is a graph showing the correlation between the dial values of processes A and B and a planar uniformity 3σ of the plasma process in the apparatus shown in FIG. 1.

An experiment performed for evaluating the uniformity control characteristics for the processes A and B will be described. In this experiment, a step of etching a uniform polysilicon wafer (poly-solid wafer) with no resist pattern for 25 sec was performed while changing the dial value of the impedance setting section 30 little by little. FIG. 5 is a graph showing the correlation between the dial values DV of the processes A and B and a planar uniformity $3\sigma$ of the plasma process. Note that $\sigma$ represents standard deviation.

As is apparent from FIG. 5, the impedance of the impedance setting section 30 was changed little by little while changing the dial value. Consequently, the planar uniformity changed largely, and a dial value with which the planar uniformity became minimum existed for each of the processes A and B. In this case, in the process A, the dial value with which the planar uniformity became minimum was approximately 11.5. In the process B, the dial value with which the planar uniformity became minimum was approximately 15.8.

The processes A and B were performed with each of the conventional apparatus and the apparatus of this embodiment. The obtained evaluation result will be described.

Figure 6A:
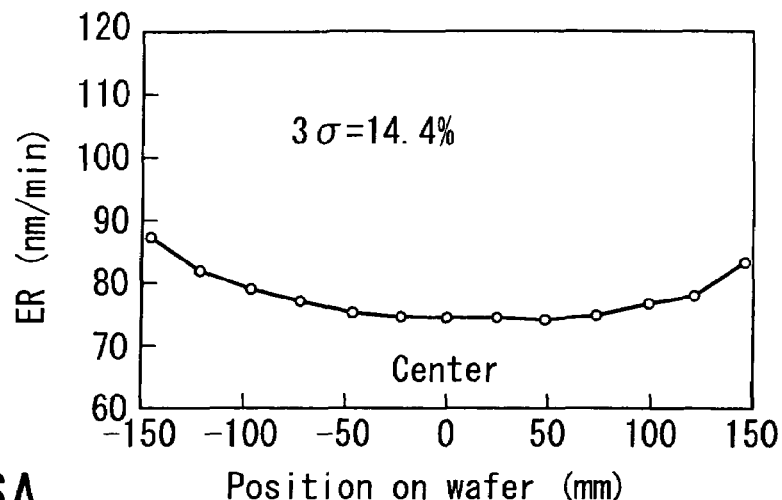
FIGS. 6A to 6C are graphs showing the distribution of the etching rate on a wafer with a diameter of 300 mm when the processes are performed with a conventional apparatus and the apparatus shown in FIG. 1.
Figure 6B:
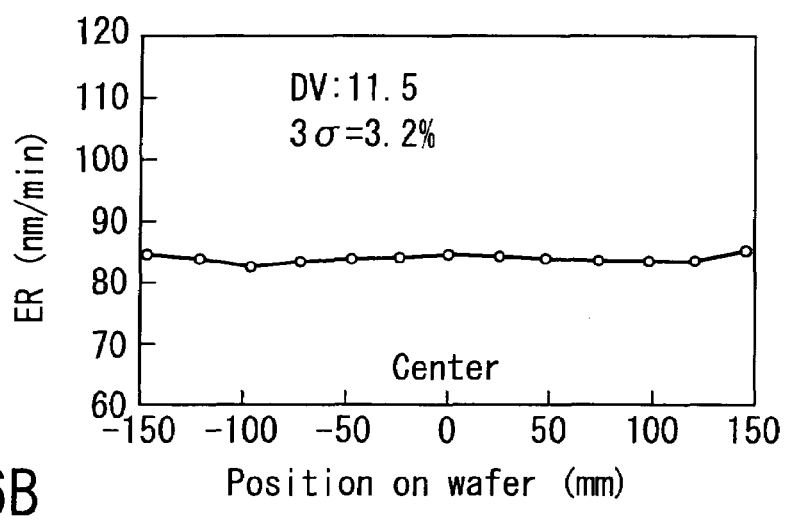
Figure 6C:
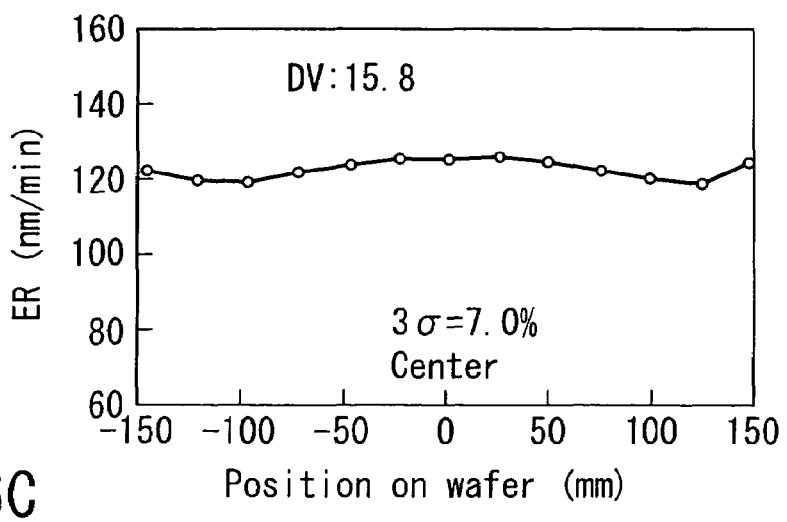

FIGS. 6A to 6C are graphs showing the distribution of an etching rate ER on a wafer with a diameter of 300 mm when the processes are performed with the conventional apparatus and the apparatus of this embodiment. As the conventional apparatus, one in which both the upper and lower electrodes were fixed and the impedance was adjusted for the process B was used.

FIG. 6A shows a result obtained by performing the process A with the conventional apparatus. A result obtained by performing the process B with the conventional apparatus is omitted. FIG. 6B shows a result obtained by performing the process A with the apparatus of this embodiment. FIG. 6C shows a result obtained by performing the process A with the apparatus of this embodiment.

When the process B was performed with the conventional apparatus, although not shown, a good planar uniformity was obtained concerning the plasma process. When the process A was performed with the conventional apparatus, as shown in FIG. 6A, the etching rate ER was low at the wafer center, and increased toward the peripheral portion of the wafer. The planar uniformity $3\sigma$ of etching became worse to about 14.4%.

In contrast to this, with the apparatus of this embodiment, by referring to the result shown in FIG. 5 described above, the process A was performed with a dial value DV of 11.5, and the process B was performed with a dial value DV of 15.8. As a result, as shown in FIG. 6B, with the process A, the planar uniformity $3\sigma$ of the plasma process was maintained as very high as about 3.2%. As shown in FIG. 6C, with the process B, the planar uniformity $3\sigma$ of the plasma process was maintained as fairly high as about 7.0%. Hence, with the apparatus of this embodiment, the planar uniformity of the plasma process was maintained high in both the processes A and B.

The impedance setting section 30 can be formed mainly of an inexpensive, very small electrical element. Hence, as compared to the conventional plasma processing apparatus in which one of the upper and lower electrodes can vertically move, the structure is very simple, and the installation space can be greatly decreased. The employed dial values of the impedance setting section 30 are merely examples, and the optimal value changes in accordance with the process conditions or the like.

FIG. 2 shows a case wherein, as the impedance setting section 30, a series connection circuit of the fixed coil 40 and variable capacitor 42 is connected between the RF line 24 and ground. Alternatively, the impedance setting section 30 may employ circuit configurations as shown in, e.g., FIGS. 7A to 7G. FIGS. 7A to 7G are circuit diagrams showing modifications of the impedance setting section 30.

FIG. 7A shows a circuit in which a fixed coil 40 and variable capacitor 42 are interchanged. FIG. 7B shows a circuit in which a variable coil 50 capable of changing the inductance, and a fixed capacitor 52 are connected in series. In place of the fixed capacitor 52, a variable capacitor 42 may be provided. FIG. 7C shows a circuit in which a series circuit of a variable capacitor 42 and fixed coil 55 is connected in parallel to a fixed coil 40. With this arrangement, the series resonance of the variable capacitor 42 and fixed coil 55 can minimize the impedance. The parallel resonance of the variable capacitor 42, fixed coil 40, and fixed coil 55 can maximize the impedance.

FIG. 7D shows a circuit in which a series circuit of a variable coil 50 and fixed capacitor 54, and a fixed capacitor 52 are connected in parallel to each other. FIG. 7E shows a circuit in which a parallel connection circuit of a fixed capacitor 52 and fixed coil 40, another fixed capacitor 54, and a variable coil 50 are sequentially connected in series in this order. In this circuit, for example, the parallel resonance frequency obtained by the fixed coil 40 and fixed capacitor 52 is matched with the frequency of the second RF power supply 28. Then, the impedance of the impedance setting section 30 against the RF power supply 28 can be reliably increased to about 10 times or more.

In the circuit shown in FIG. 7F, switches 53 are respectively connected in series to a plurality of capacitors 52. The switches 53 are turned on/off in an arbitrary combination, so the capacitance is changed stepwise. In the circuit shown in FIG. 7G, switches 53 are respectively connected in series to a plurality of inductors 40. The resultant series circuits are combined with a variable capacitor 42. When the switches 53 are turned on/off in an arbitrary combination, the inductance is changed stepwise. Fine adjustment is performed with the variable capacitor, and rough adjustment is performed by switching the inductors. As a result, a wide control range can be obtained while enabling fine control.

Where there are two target impedance values largely distant from each other, rough adjustment is performed by switching fixed circuit elements. Then, fine adjustment is performed by continuously changing the frequency. A change in impedance as the target can be realized with high precision.

Second Embodiment

In the first embodiment, a process mainly aimed at improving the planar uniformity of the plasma process is described. Sometimes a process in which the plasma stability must be maintained high may be performed.

Regarding the plasma stability, sometimes the plasma in the process space S may or may not leak below the rectifying plate 22 (see FIG. 1) depending on the process conditions, e.g., the RF power to be applied, the process pressure, or the like. Between these cases, the impedance obtained when seeing the plasma in the process chamber 4 from the first or second matching circuit 12 or 26 (see FIG. 1) differs. Accordingly, the matching circuits 12 and 26 automatically change the impedances to perform input impedance matching, i.e., change the adjustment positions, as described above.

In this case, if the plasma stabilizes without or while leaking, no problems occur. Assume, however, that the plasma is in the intermediate state, i.e., in the critical state between leaking and non-leaking. In this case, the adjustment position repeats changing often, so that the matching circuits can perform impedance matching. Therefore, plasma discharge does not stabilize, and in the worst case, the plasma itself is not generated.

In view of this, according to the second embodiment, to stabilize the plasma, an impedance setting section 30 identical to that used in the first embodiment is used. The arrangement of the entire plasma processing apparatus is completely the same as that of the first embodiment. As a plasma process, a case will be described wherein an anti-reflection coating made of an organic substance and formed under a photoresist film is to be etched.

The process conditions in this case are as follows:

| | |
|---|---|
| Process gas (etching gas): | $CF_4/O_2$ = 70/10 sccm |
| Process pressure: | 0.67 Pa (5 mTorr) |
| Lower electrode temperature: | 60° C. |

An experiment on the plasma stability will be described. In this experiment, the plasma process was performed while changing the combination of the RF powers to be applied to the upper and lower electrodes 6 and 18 in various manners. The obtained plasma stability was visually checked. The RF power to the upper electrode was changed within the range of 100 W to 500 W. The RF power to the lower electrode was changed within the range of 30 W to 105 W. The dial value of the impedance setting section 30 was fixed at 15.2.

FIG. 8 shows the obtained evaluation result. FIG. 8 is a diagram showing plasma stability which is obtained when the combination of RF powers to be applied to the upper and lower electrodes is changed. The criteria for judgment of the plasma stability are as follows.

○: No flickering is visually observed above and below the rectifying plate.

No fluctuation or hunching occurs in reflection of the voltage or RF power.

Δ: Flickering is visually observed below the rectifying plate.

No fluctuation or hunching occurs in reflection of the voltage or RF power.

x: Flickering is visually observed above and below the rectifying plate.

Reflection of the voltage or RF power fluctuates largely.

Hunching occurs even once.

Operation ceases midway due to reflection error of RF power.

As is apparent from FIG. 8, the state of the plasma largely changed depending on the combination of the powers respectively applied to upper and lower electrodes 6 and 18. Particularly, when the powers applied to the upper and lower electrodes 6 and 18 were 200 W and 45 W, respectively, the plasma state was x and was accordingly very unstable.

In view of this, while maintaining power application showing the unstable state, i.e., while applying RF powers of 200 W and 45 W to the upper and lower electrodes 6 and 18, respectively, the dial value of the impedance setting section 30 was variously changed. A change in plasma state at this time was visually observed.

Figure 9:
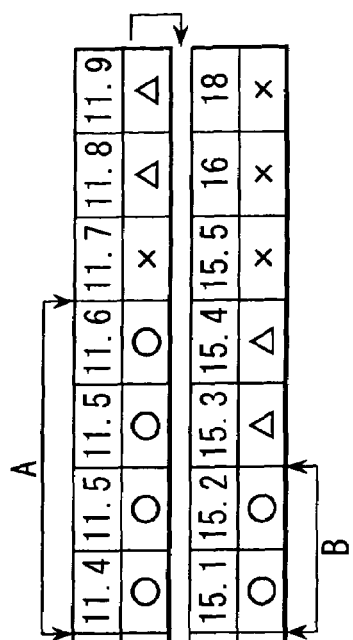
FIG. 9 is a diagram showing the correlation between the dial value of the impedance setting section and the plasma stability in the apparatus shown in FIG. 1.

FIG. 9 shows the obtained evaluation result. FIG. 9 is a diagram showing the correlation between a dial value DV of the impedance setting section and the plasma stability. As is apparent from FIG. 9, as a region where the plasma was generated stably (portion ○), two regions existed, i.e., a region A with a dial value DV of 11.4 to 11.6 and a region B with a dial value DV of 15.1 to 15.2.

The region A is where the plasma stabilizes while leaking. The region B is where the plasma stabilizes without leaking (no leaking occurs).

In this manner, when determining the process conditions, a dial value for the process may be appropriately selected and defined in advance. Then, the plasma process can be performed while the plasma is generated stably. For example, a plasma process is performed by using a recipe incorporating the dial value defined as described above. When the dial value is appropriately selected, a wide range can be set for the process conditions, and the process margin can be enlarged.

The types of the processes and the corresponding dial values are merely examples. Various appropriate dial values can be determined in accordance with the process conditions.

Third Embodiment

Concerning the impedance setting section 30 or the like as described above, it is generally prepared as one of a large number devices manufactured with the same standard in accordance with the number of accepted orders for plasma processing apparatuses. In this case, a small difference in characteristics inevitably occurs in each impedance setting section 30 due to manufacture variance or the like. More specifically, the same correlation between the dial value of the impedance setting section 30 and an actual reactance at that time is not always established between different impedance setting sections 30. Rather, this correlation often differs due to the machine difference (individual difference) of the impedance setting section. Assume that a plasma process is performed with a predetermined dial value. In this case, with some apparatus, the process may be performed with a high planar uniformity. With another apparatus, even when the process is performed with the same dial value, a high planar uniformity may not be obtained.

For this reason, to compensate for an intrinsic difference of each impedance setting section and of a matching circuit 26 connected to it, calibration is performed. In this case, the reactance of the impedance setting section 30 is used as the parameter for calibration.

Figure 10:
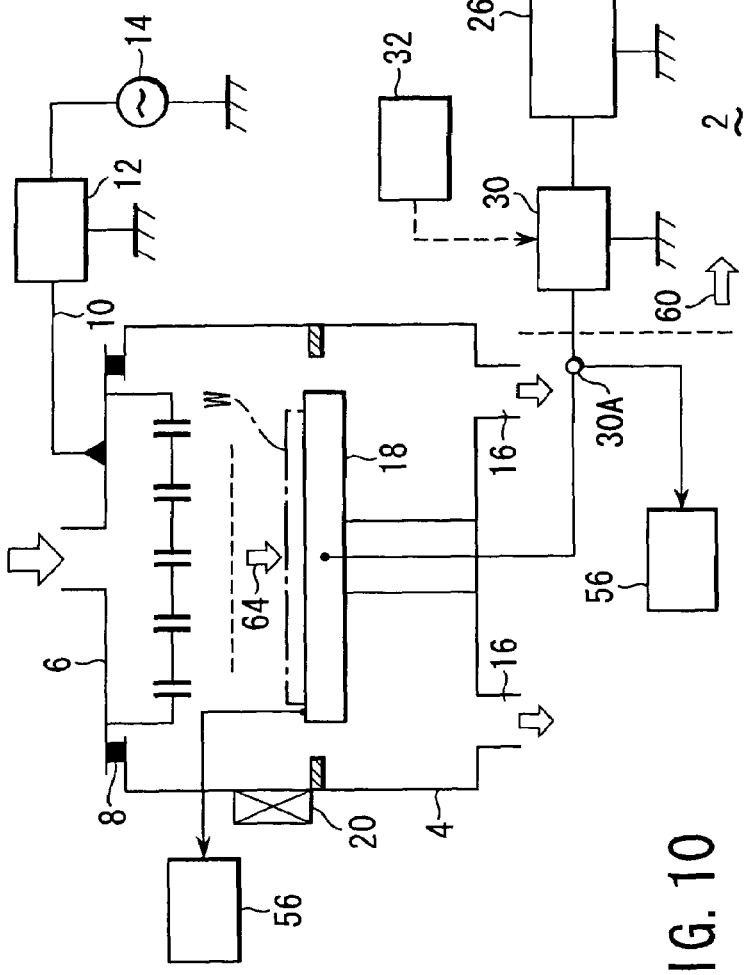
FIG. 10 is a diagram showing how a reactance measurement unit is attached in the apparatus shown in FIG. 1 when performing calibration.

FIG. 10 is a diagram showing how a reactance measurement unit is attached when calibration is to be performed in a plasma processing apparatus. As shown in FIG. 10, a plasma processing apparatus 2 in this case has completely the same arrangement as that described previously with reference to FIG. 1.

First, to measure the reactance, a reactance measurement unit 56 is attached to an output terminal 30A (lower electrode 18 side) of the impedance setting section 30. The correlation between the dial value and reactance is measured by using an instrument, such as an impedance analyzer or network analyzer. In this case, the reactance in a direction of an arrow 60 of FIG. 10, i.e., a reactance including the impedance setting section 30 and a second matching circuit 26, is measured. Empirically, the machine difference tends to be small on a side where the capacitance of a variable capacitor 42 is small, and large on a side where the capacitance of the variable capacitor 42 is large.

Figure 11A:
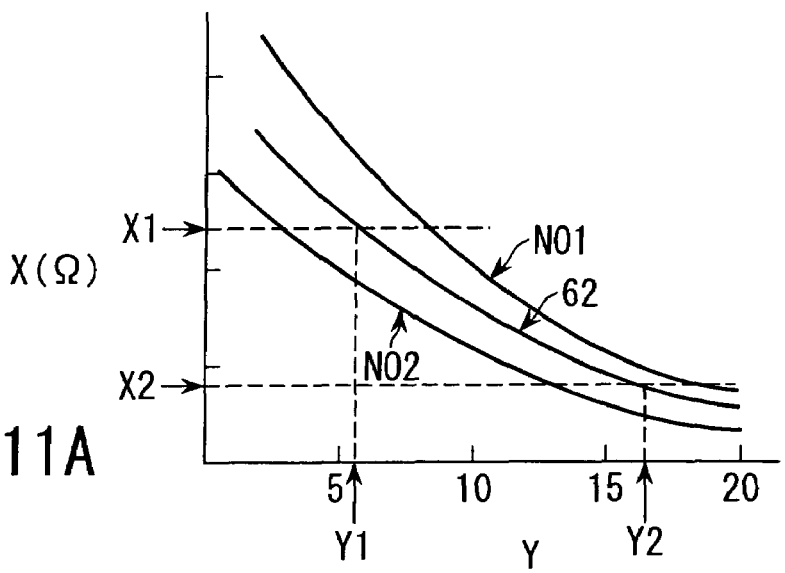
FIGS. 11A to 11C are graphs schematically showing the correlation between the dial value and reactance, the correlation between the dial values before and after calibration, and the correlation between the dial value and reactance, respectively, of a plurality of (two) plasma processing apparatuses each having the arrangement shown in FIG. 1.
Figure 11B:
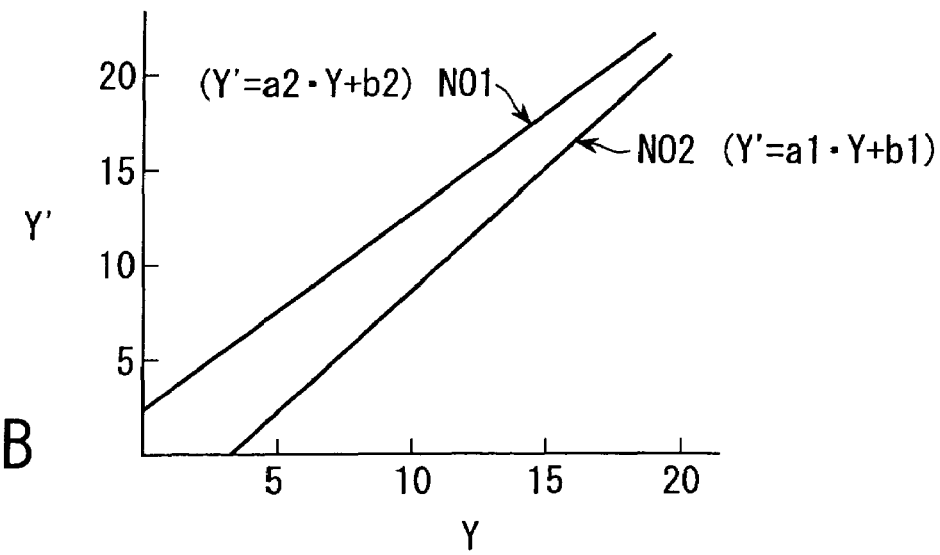
Figure 11C:
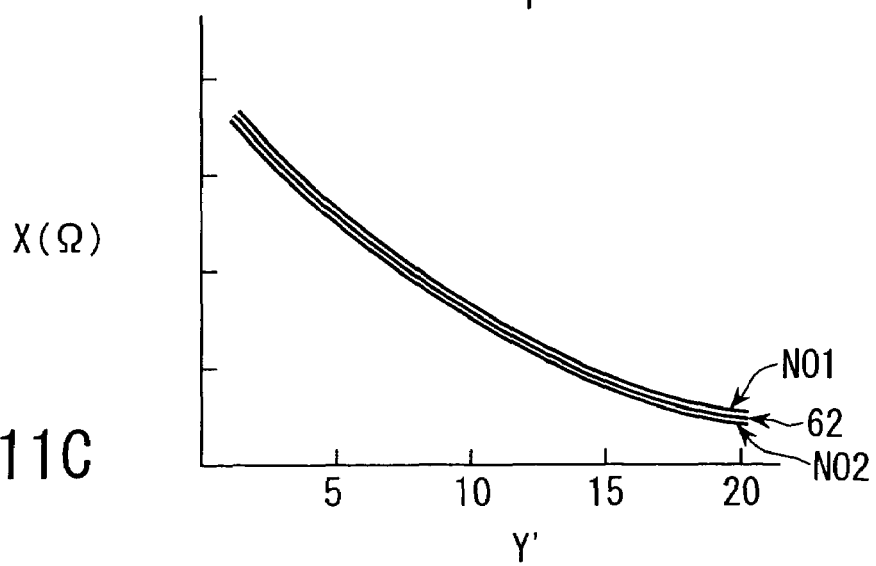

FIGS. 11A, 11B, and 11C are graphs schematically showing the correlation between dial values DV of a plurality of (two) plasma processing apparatuses and their reactances. FIG. 11A shows the correlation between a pre-calibration dial value Y and a reactance X. FIG. 11B shows the correlation between the pre-calibration dial value Y and a post-calibration dial value Y'. FIG. 11C shows the correlation between the post-calibration dial value Y' and the reactance X. As described above, FIG. 11A shows the correlation between the dial values and reactances of the two plasma processing apparatuses NO1 and NO2 that should have the same characteristics. FIG. 11A also shows a reference correlation 62 as the predetermined reference.

When performing calibration, the differences between the reference correlation 62 and the correlations of the plasma processing apparatuses NO1 and NO2 are obtained. A calibration function or calibration table (calibration data) prepared to eliminate these differences is stored in an adjusting member 44 (see FIG. 2). FIG. 11B shows dial values before and after this calibration. In actual process control, when a dial value in the recipe is instructed by an impedance controller 32 (see FIG. 2), the variable capacitor 42 is controlled based on this calibration function or calibration table.

The calibration function can be obtained by using, e.g., a two-point calibration scheme. The dial value Y in the reference correlation 62 when the reactance is X1 is defined as Y'1, and that when the reactance is X2 is defined as Y'2. The pre-calibration dial value with which the reactance of the apparatus NO1 is X1 is defined as Y11, and that with which the reactance is X2 is defined as Y12. When a function Y'=a1·Y+b1, which is the simplest as the calibration function, is employed, the following simultaneous system of equations can be obtained for the two points:

$Y'1 = a1 \cdot Y11 + b1$ $Y'2 = a1 \cdot Y12 + b1$

Coefficients a1 and b1 of the calibration function for the apparatus NO1 can be expressed by the following equations:

$a1 = (Y'1 - Y'2)/(Y11 - Y12)$ $b1 = Y'1 - (Y'1 - Y'2) \cdot Y11/(Y11 - Y12)$

Coefficients a2 and b2 of the calibration function for the apparatus NO2 can be obtained with the same procedure. As shown in FIG. 11B, the correlations (calibration function) between the pre-calibration dial values Y and post-calibration dial values Y' of the apparatuses NO1 and NO2 can be expressed as two straight lines having different gradients and intercepts. The factor of the machine difference may include the machine difference of the inductance of the fixed coil and the machine difference of the minimum capacitance of the variable capacitor. In a calibration curve, the former influences a gradient a, and the latter influences an intercept b.

FIG. 11C shows the correlations between the dial values Y' after calibration and the reactances X. When the pre-calibration dial value Y is plotted along the axis of abscissa (FIG. 11A), the three curves are largely separate from each other. When the post-calibration dial value Y' is plotted along the axis of abscissa, these three curves almost coincide with each other. Therefore, either the apparatus NO1 or NO2 has the same reactance X against the same dial value Y'. If this calibration function is obtained in advance for each plasma processing apparatus, with process conditions (recipe) including the same dial value, for example, the same plasma state can always be formed in the respective apparatuses regardless of the machine difference.

(Calibration Including Process Chamber: 1)

In the above case, the reactance measurement unit 56 is connected to the output terminal 30A of the impedance setting section 30. Then, the reactance seen from the direction of the arrow 60 is measured. A difference may sometimes occur from one apparatus to another in the reactance, depending on the apparatus arrangement and the component arrangement (exchange of a component and the like). In this case, as shown in FIG. 10, the reactance measurement unit 56 is connected to the lower electrode 18. The impedance setting section 30 and its RF power supply side are separated from the apparatus. The reactance (when the frequency is 60 MHz) seen from the direction of an arrow 64 is measured in the same manner as described above.

The calibration function and calibration tables are stored in the adjusting member 44 (see FIG. 2) in the same manner as described above. Both calibration seen from the direction of the arrow 60, which is described previously, and calibration seen from the direction of the arrow 64 can be performed. Thus, one impedance setting section 30 can be used for the respective apparatuses. The impedance setting section 30 need not be replaced for another one having the same standard, and calibration need not be performed again.

(Calibration Including Process Chamber: 2)

In the above calibration, the reactance measurement unit 56 is connected to the lower electrode 18, and a change in reactance is measured. Although this method has high precision, it does not actually generate plasma. Thus, the change does not reflect a difference in resonance depending on the wafer state or the process conditions. Regarding this, alternatively, plasma may be generated actually. The correlation between the dial value and the adjustment position detected by the position sensor 38 of the second matching circuit 26 may be measured (see FIG. 2). More specifically, a difference in reactance occurs depending on the arrangement of the apparatus, the arrangement of the components, the wafer state, the process conditions, and the like. Accordingly, the behavior of the matching adjustment position with respect to the dial value also fluctuates.

Figure 12:
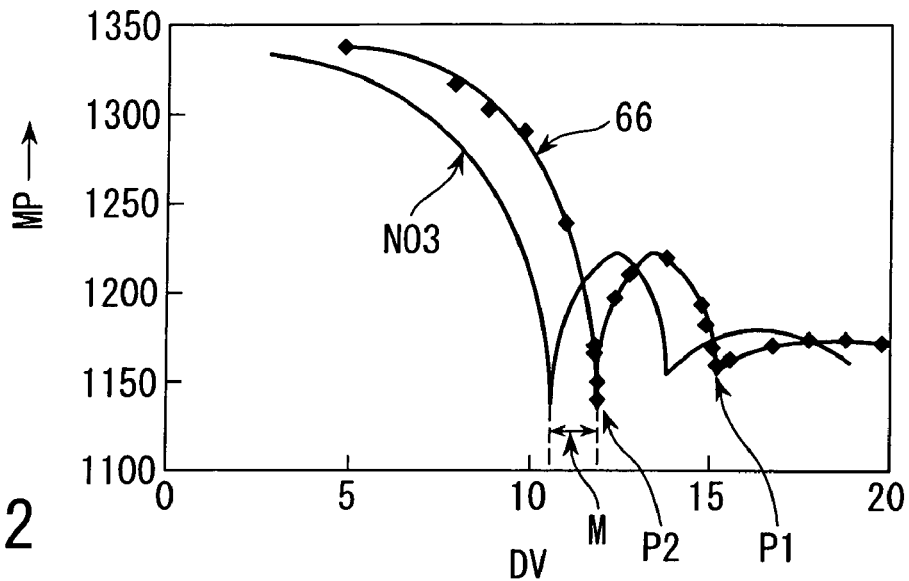
FIG. 12 is a graph showing the correlation between the dial value and matching position in the apparatus shown in FIG. 1.

FIG. 12 is a graph showing the correlation between the dial value DV and a matching position MP. FIG. 12 also shows a reference correlation 66 as the reference for the matching position MP and dial value DV. The reference correlation 66 includes points where the correlation between the matching position MP and dial value DV changes largely, i.e., two inflection points P1 and P2. Calibration is performed by referring to either one of the inflection points P1 and P2, e.g., the inflection point P1.

For example, assume that a correlation 68 between the matching position and dial value of a plasma processing apparatus NO3 differs from the reference correlation 66 by a dial value M. In this case, for example, a calibration table that cancels this value M is created in advance. The calibration table is stored in the adjusting member 44 (see FIG. 2) in advance. Then, calibration is performed.

In the above calibration, a case is described wherein the correlation between the matching circuit and dial value is obtained. In place of this, a correlation between another one or a plurality of other parameters and the dial value can be utilized. Other parameters include the voltage amplitude of the RF power applied from the electrode side where the impedance setting section is connected, the adjustment value of the matching circuit of this electrode side, the voltage amplitude of the RF power applied from a counter electrode side, the adjustment value of the matching circuit of this electrode side, and an output from a spectroscope for etching end point detection. Alternatively, the impedance controller or the like may have the function of automatically changing the dial value to acquire data concerning changes in parameters described above, and performing the calibration scheme as described above automatically.

Fourth Embodiment

Figure 13:
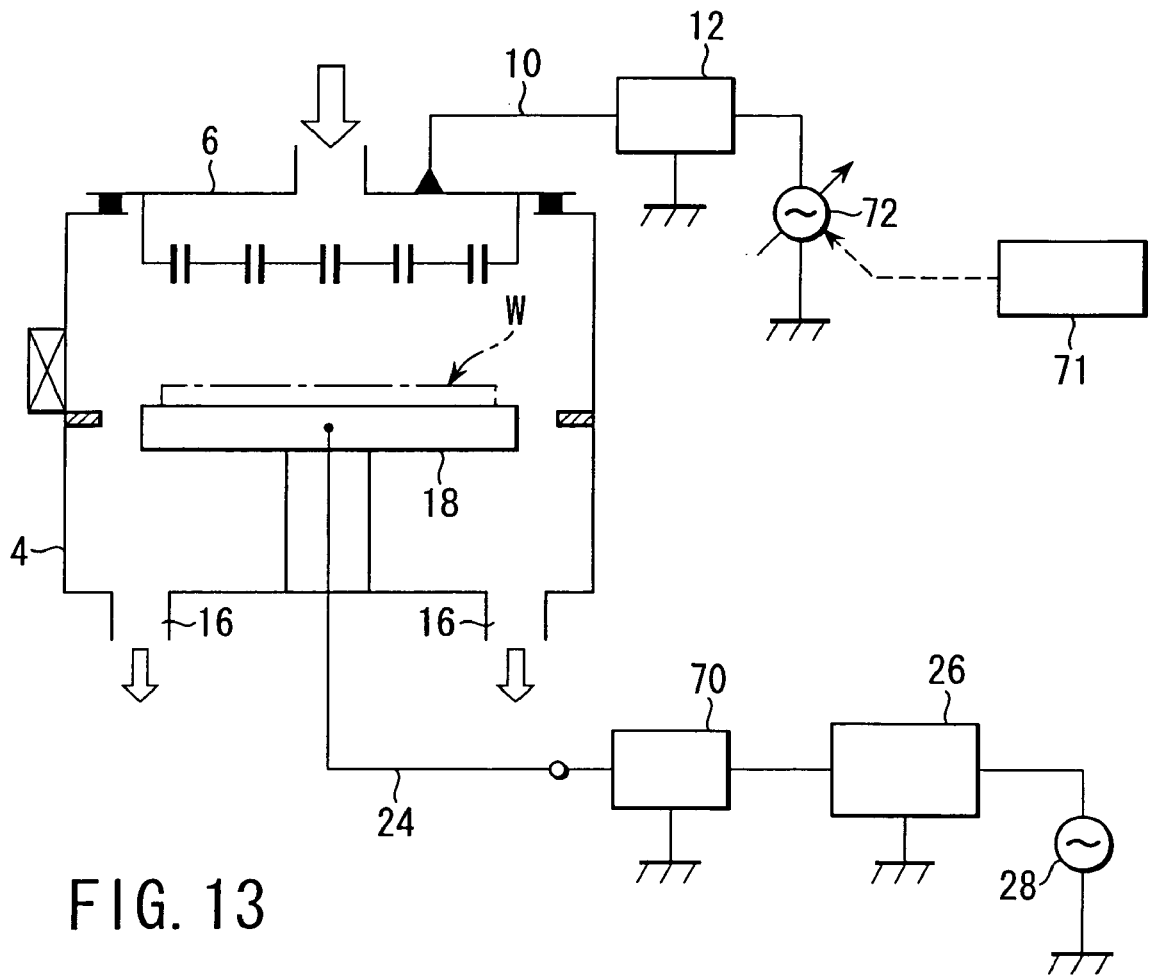
FIG. 13 is a schematic diagram showing the arrangement of a plasma processing apparatus according to the fourth embodiment of the present invention, which uses an impedance setting section and a variable-frequency RF power supply.

In the embodiments described above, the impedance setting section 30 that can change the impedance is provided. In place of the impedance setting section 30, an impedance setting section 70 with a fixed impedance may be provided, as shown in FIG. 13. In this case, the impedance setting section 70 is connected to one electrode, e.g., the lower electrode 18, while a variable-frequency RF power supply 72 which can change the frequency of the RF power is connected to the opposing electrode, e.g., the upper electrode 6. The frequency of the RF power generated by the RF power supply 72 is adjusted by a controller 71. This adjustment is based on a recipe defining the process conditions or the like with which the wafer is to be processed.

In the RF power supply 72, when a fundamental frequency fo is 60 MHz, an appropriate fluctuation width±Δf is about ±5%. As the variable-frequency RF power supply 72, an RF power supply disclosed in, e.g., Jpn. Pat. Appln. KOKAI Publication No. 5-114819, and Jpn. Pat. Appln. KOKAI Publication No. 9-55347 (corresponding to U.S. Pat. No. 5,688, 357), or the like can be used. If a wider fluctuation range is needed, it can be realized by switching a plurality of fixed circuit elements.

More specifically, when control of the power supply frequency and variable impedance elements are used in combination, a wide control range of the impedance can be obtained in a variable frequency range that cannot ordinarily be obtained.

In this manner, when the frequency of the RF power supply 72 is variable, a frequency with which the planar uniformity of the plasma process becomes optimal can be set in accordance with the process conditions.

Fifth Embodiment

FIG. 1 and the like show a case where the impedance setting section 30 and the like are interposed in the RF line 24 connected to the lower electrode 18. Alternatively, as shown in the fifth embodiment of FIG. 14, an impedance setting section 30 having the same arrangement can be arranged only in an RF line 10 connected to an upper electrode 6. Alternatively, an impedance setting section 30 can be arranged in each of RF lines 10 and 24.

Figure 15:
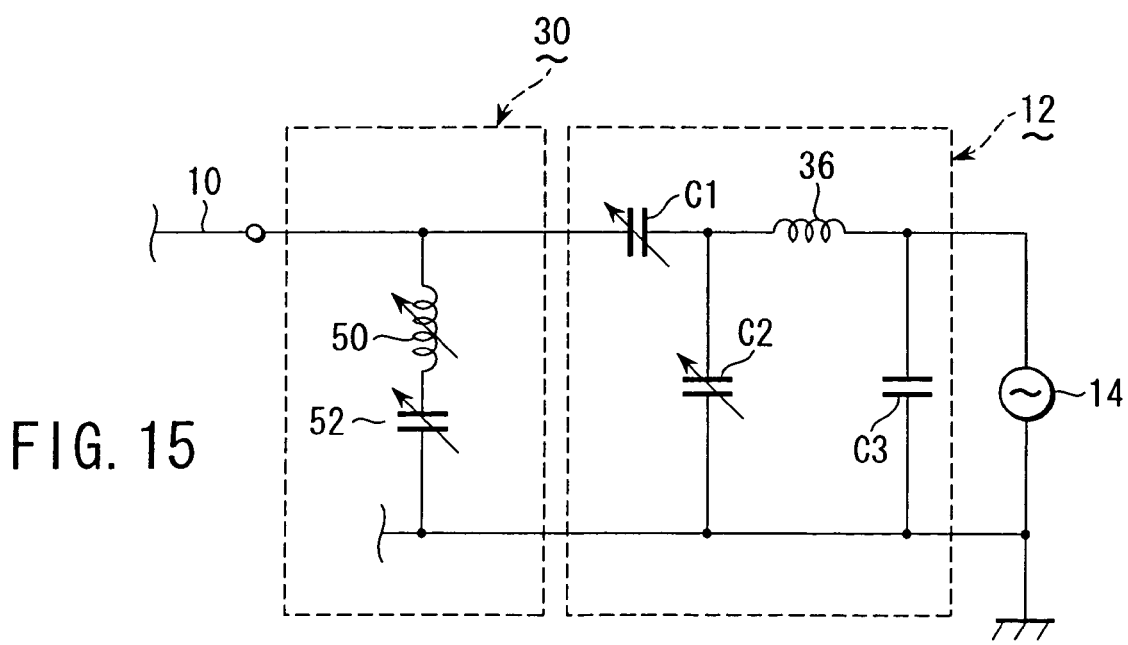
FIG. 15 is a circuit diagram showing a matching circuit and impedance setting section connected to the upper electrode in the apparatus shown in FIG. 14.

FIG. 15 is a circuit diagram mainly showing a matching circuit and impedance setting section connected to the upper electrode. A first matching circuit 12 has the same arrangement as that obtained by omitting the fixed coil 34 from the matching circuit 26 shown in FIG. 2. Regarding an impedance setting section 30, it is formed as a series circuit of a fixed capacitor 52 and variable coil 50. The inductances of the respective coils and the capacitances of the capacitors are determined in accordance with the frequency of a corresponding RF power. This is different from the case shown in FIG. 2. Description on an impedance controller, an adjustment member, a matching adjustment position sensor, and the like is omitted.

Figure 14:
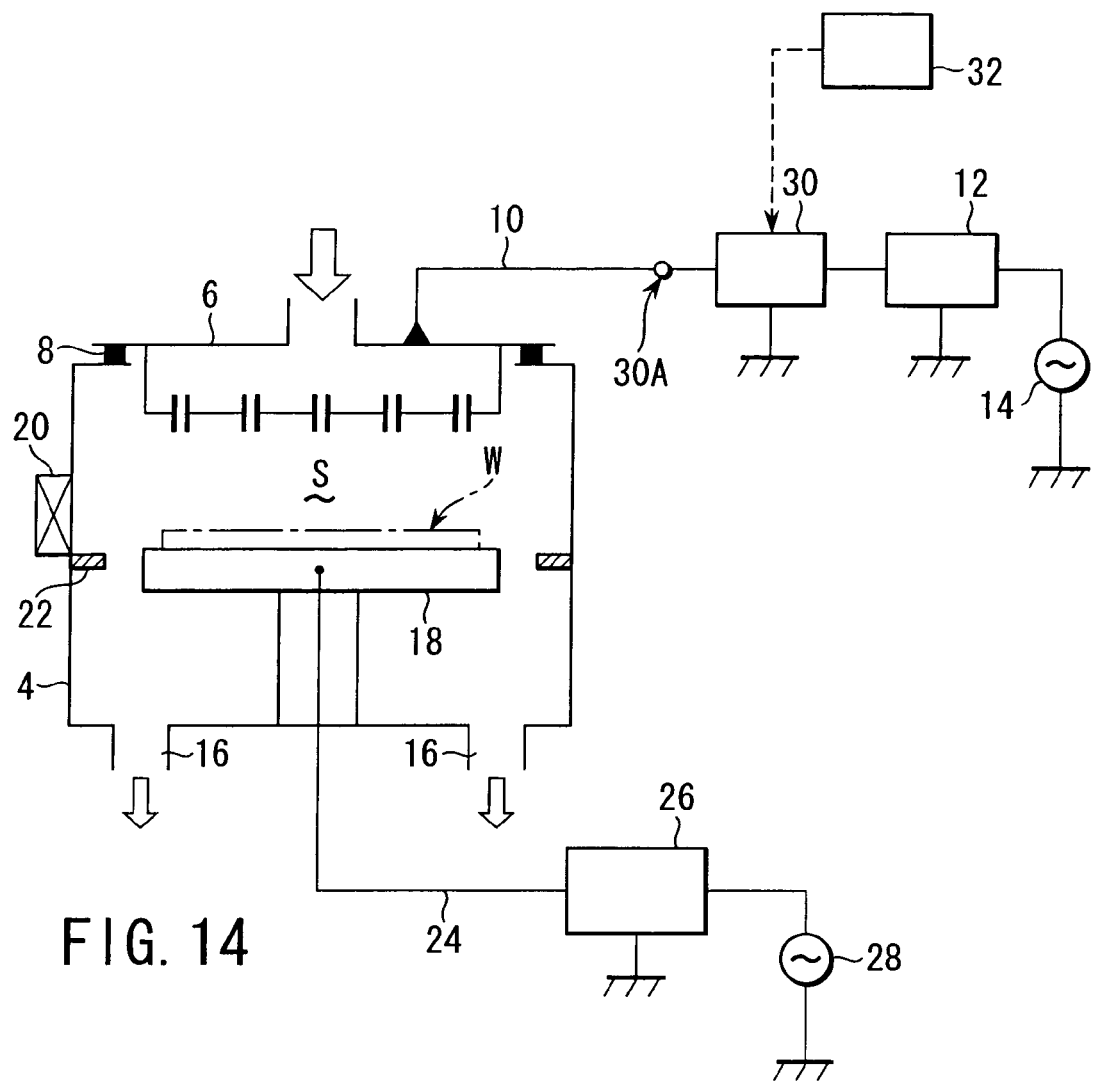
FIG. 14 is a schematic diagram showing the arrangement of a plasma processing apparatus according to a fifth embodiment of the present invention, in which an impedance setting section is connected to an upper electrode.

An evaluation result of an experiment in which a plasma ashing process is performed with the apparatus arrangement as shown in FIGS. 14 and 15 will be described.

In this ashing process, a target substrate formed in the following manner was used. Namely, a 100-nm thick TEOS $SiO_2$ film was formed on a silicon wafer. An 80-nm thick BARC (organic-based anti-reflection coating) photoresist was deposited on the upper surface of the $SiO_2$ film, thus forming the target substrate. The photoresist had a 400-nm thick, 180-nm wide line pattern.

The etching conditions for the BARC and $SiO_2$ were as follows.

<BARC>

| | |
|---|---|
| Process gas (etching gas): | CH$_4$/CHF$_3$/O$_2$ = 157/52/11 sccm |
| Process pressure: | 0.93 Pa (7 mTorr) |
| Lower electrode temperature: | 75° C. |
| RF power: | upper electrode/lower electrode = 100/500 watt |
| Overetching: | 10% |

<SiO$_2$>

| | |
|---|---|
| Process gas (etching gas): | C$_4$F$_8$/Ar = 17/400 sccm |
| Process pressure: | 5.3 Pa (40 mTorr) |
| Lower Electrode Temperature: | 75° C. |
| RF power: | upper electrode/lower electrode = 600/600 watt |
| Overetching: | 20% |

Figure 16:
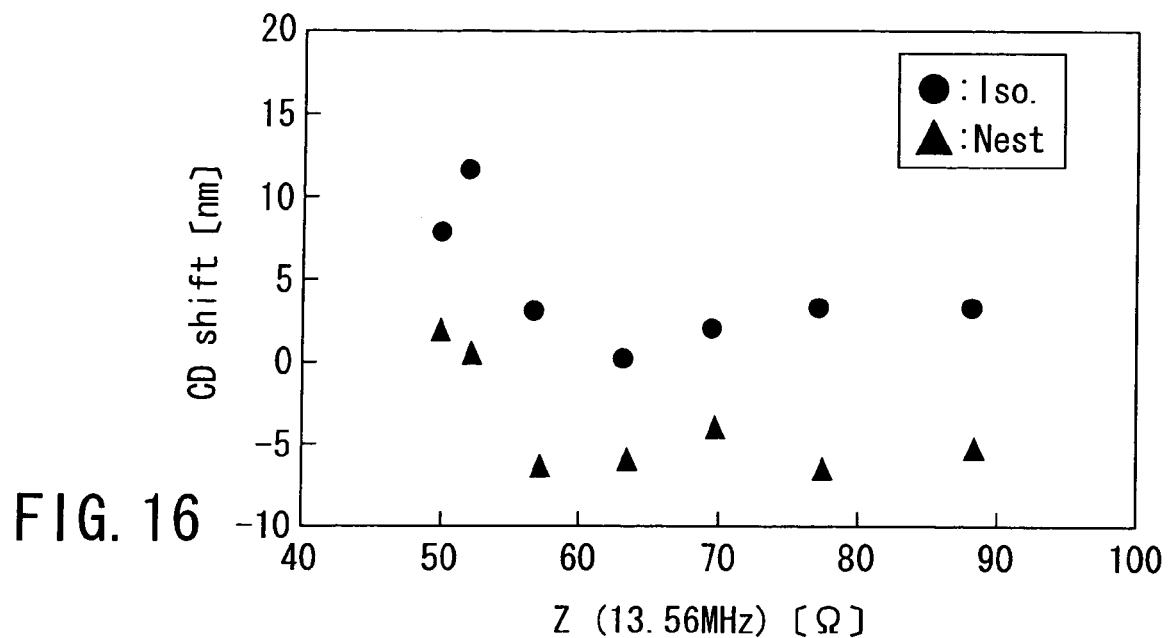
FIG. 16 is a graph showing a change in CD shift as a function of an impedance (13.56 MHz) in the apparatus shown in FIG. 14.

FIG. 16 is a graph showing a change in CD (Critical Dimension) shift as a function of an impedance Z (13.56 MHz) obtained by this experiment. The CD shift represents a difference between the width of TEOS SiO$_2$ before etching and resist ashing and the width of the same after photoresist etching. The impedance was changed by using the fixed capacitor 52 with a capacity of 55 pF and the variable coil 50.

Referring to FIG. 16, Iso indicates an isolated pattern, and Nest indicates a line and space (1 : 1). As shown in FIG. 16, when the impedance Z against 13.56 MHz was changed, the CD shift amount could accordingly be changed to a certain degree, e.g., by about 10 nm at maximum when the impedance Z was within the range of 40Ω to 50Ω.

Sixth Embodiment

Figure 17:
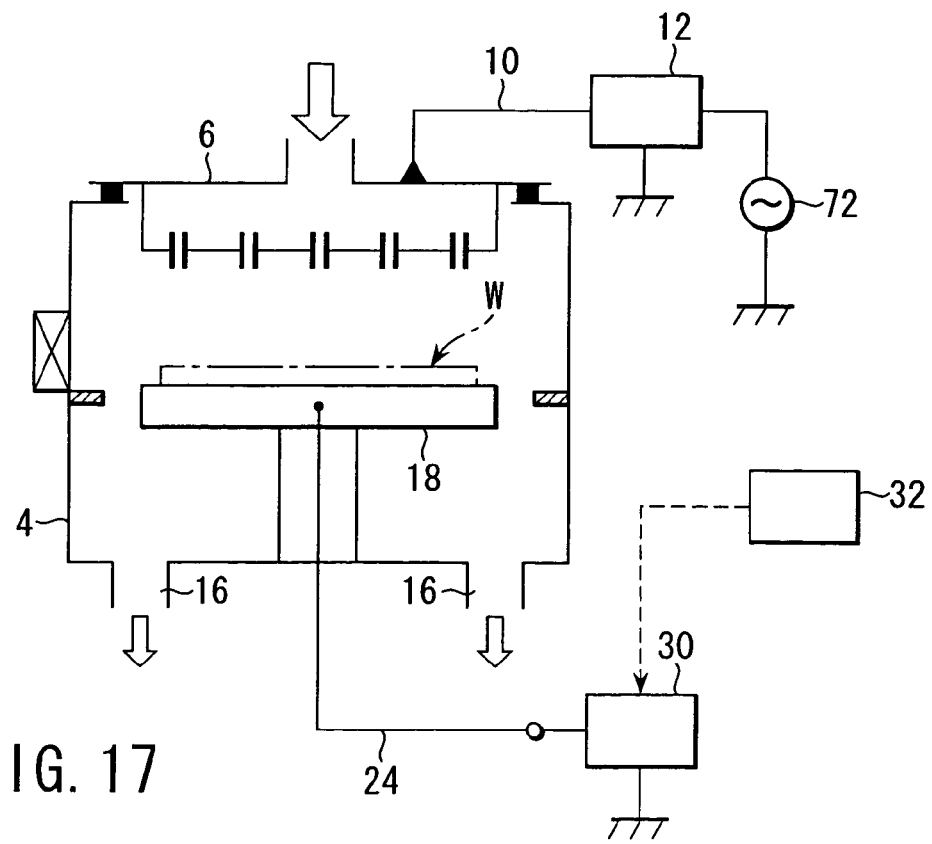
FIG. 17 is a schematic diagram showing the arrangement of a plasma processing apparatus according to a sixth embodiment of the present invention, in which an RF power supply is connected to only one electrode.

FIG. 1 and the like show an apparatus in which the RF power supplies 14 and 28 are connected to the upper and lower electrodes 6 and 18, respectively. Alternatively, an impedance setting section 30 can be applied to an apparatus in which an RF power supply is connected to only one electrode. In this case, an impedance setting section 30 is connected to an electrode opposing an electrode to which the RF power supply is connected. For example, in the structure shown in FIG. 17, this electrode is a lower electrode 18 opposing an upper electrode 6 to which a first RF power supply 14 is connected.

Seventh Embodiment

In the embodiments described above, adjustment control is performed by changing the impedance which is obtained when seeing from either one electrode the other electrode. Alternatively, an impedance seen from plasma generated in the process chamber may be controlled. The plasma generates various higher harmonics in response to the fundamental wave of the RF power applied to the plasma. The plasma state changes in accordance with how the harmonics are released from the process chamber. Hence, an impedance setting section, the impedance set value of which can be changed as described above, is connected to a predetermined member to be electrically coupled with the plasma. The impedance of the impedance setting section is set such that it can resonate with at least one of the higher harmonics.

Figure 18:
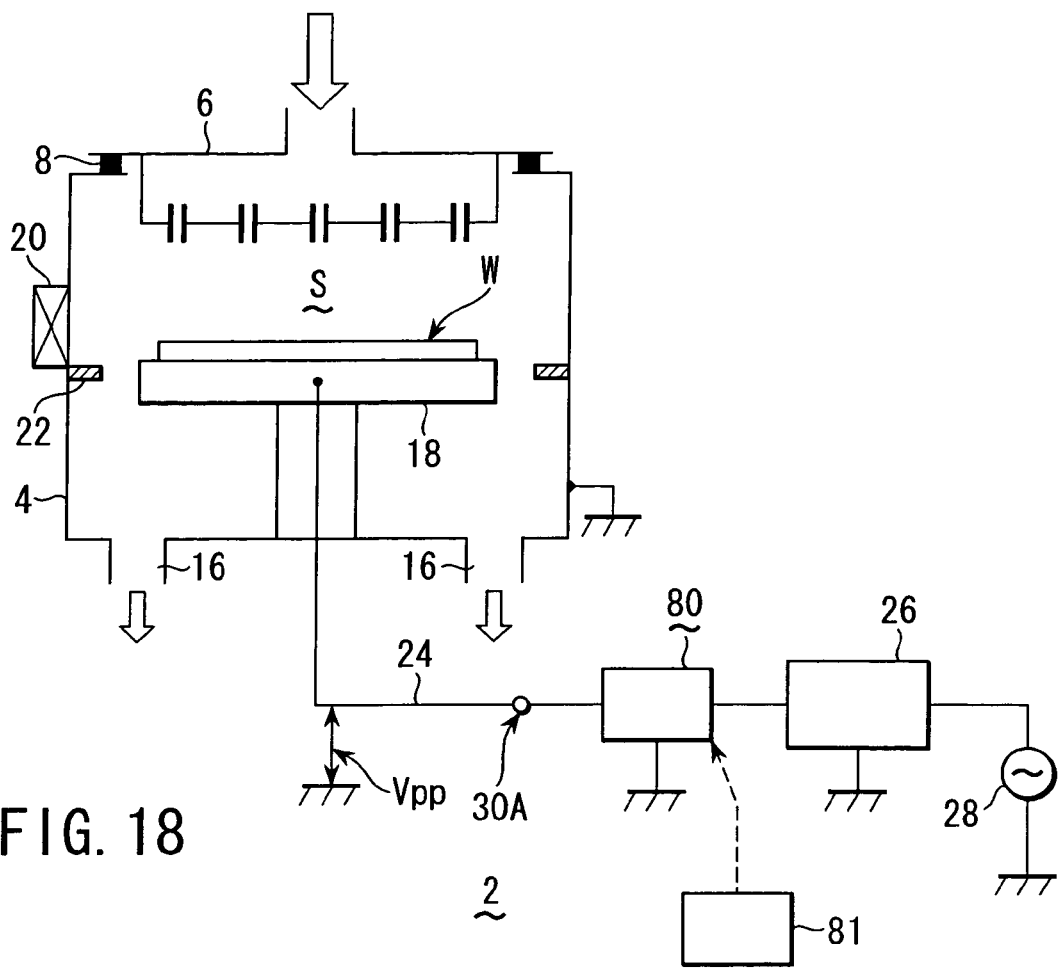
FIG. 18 is a schematic diagram showing the arrangement of a plasma processing apparatus according to a seventh embodiment of the present invention, in which a resonance impedance setting section is arranged.
Figure 19:
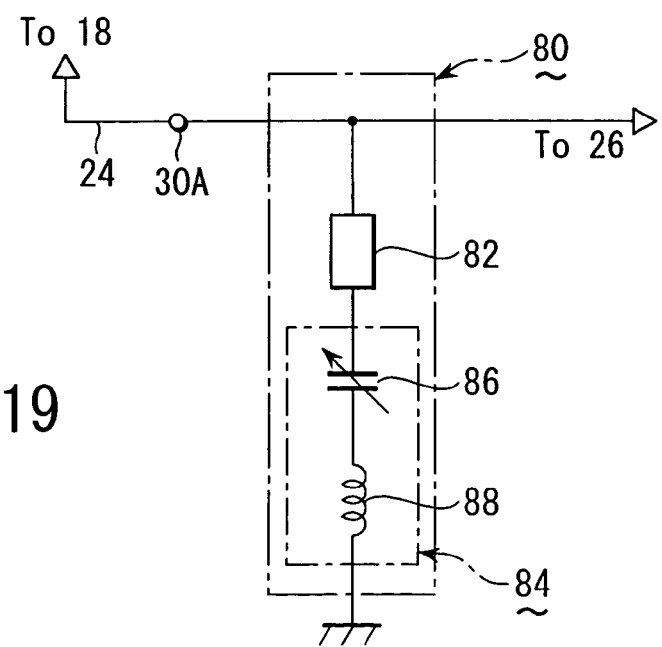
FIG. 19 is a circuit diagram showing an example of the resonance impedance setting section in the apparatus shown in FIG. 18.

FIG. 18 is a diagram showing the arrangement of a plasma processing apparatus according to the seventh embodiment of the present invention, to which a resonance impedance setting section is provided. FIG. 19 is a circuit diagram showing an example of the resonance impedance setting section. A first RF power supply 14 and first matching circuit 12 identical to those shown in FIG. 1 are omitted for facilitating understanding of the present invention.

In the apparatus shown in FIG. 18, a resonance impedance setting section 80 is arranged in place of the impedance setting section 30 of the RF line 24 shown in FIG. 1. The impedance set value of the impedance setting section 80 is adjusted by a controller 81. This adjustment is based on a recipe or the like defining the process conditions with which the wafer is to be processed. This is the same as with the impedance setting section 30.

13.56-MHz RF power as the fundamental wave is applied from a second RF power supply 28 across lower and upper electrodes 18 and 6. This generates plasma in a process space S. The plasma generates higher harmonics, e.g., second, third, fourth, fifth harmonics . . . , in response to the fundamental wave. The impedance setting section 80 variably sets the impedance seen from the plasma such that it can resonate with at least one of the plurality of higher harmonics. As described above, the 13.56-MHz RF current as the fundamental wave flows to the ground through the upper electrode 6, the sidewall of a process chamber 4, and the like.

As shown in FIG. 19, the impedance setting section 80 is formed of a series circuit of a filter 82 and one impedance change unit 84. Furthermore, the impedance change unit 84 is formed of a series circuit of a variable capacitor 86 and fixed coil 88.

The fundamental wave of the second RF power supply 28, i.e., 13.56 MHz in this case, is applied to the lower electrode 18 to which the filter 82 itself is connected. The filter 82 directly connected to an RF line 24 cuts off the fundamental wave. This aims at preventing the fundamental wave from flowing into the process chamber 4. The filter 82 selects and allows passage of a frequency higher than that of the fundamental wave. As the filter 82, a high-pass filter is used.

The capacitance of the variable capacitor 86 of the impedance change unit 84 is variable. In this embodiment, the capacitance of the variable capacitor 86 can be controlled by adjusting the impedance seen from the plasma. Then, resonance can be selected from a range of near a second harmonic to near a fourth harmonic with respect to the fundamental wave. When a plasma process such as actual etching is to be performed, the variable capacitor 86 of the impedance change unit 84 is variably adjusted. This is to control such that the impedance seen from the plasma can selectively resonate with the second, third, or fourth harmonic. Then, the planar uniformity of the plasma process for a wafer W can be maintained high. Also, the plasma state in the process chamber 4 can be maintained stably.

Figure 20:
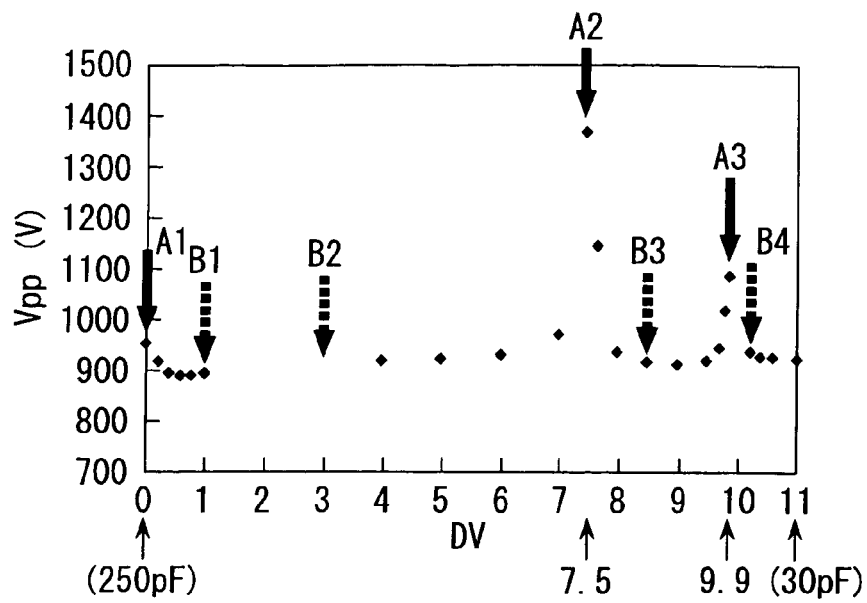
FIG. 20 is a graph showing the dependency of a bottom voltage Vpp as the voltage value of the lower electrode on the capacitance of the variable capacitor in the apparatus shown in FIG. 18.
Figure 22:
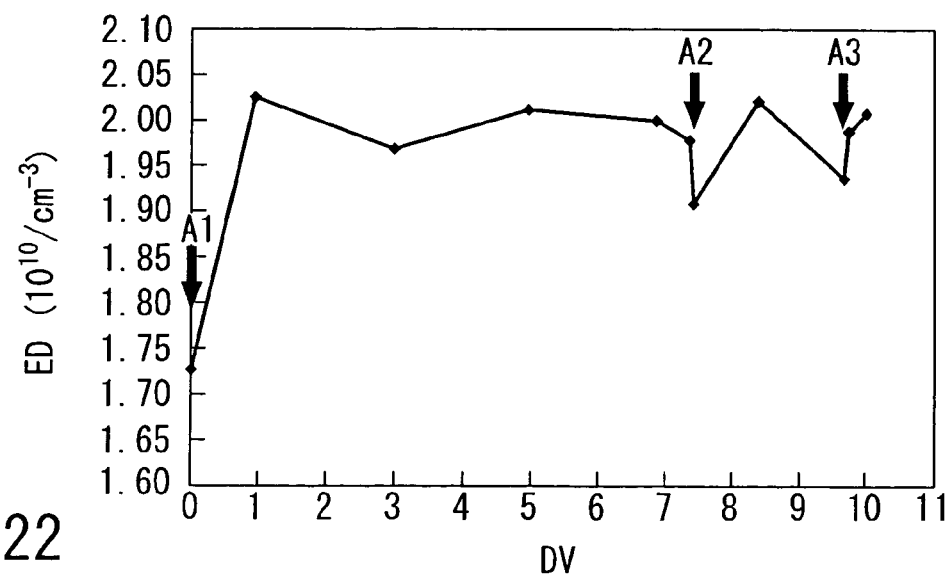
FIG. 22 is a graph showing the dependency of the electron density in plasma on the capacitance of the variable capacitor in the apparatus shown in FIG. 18.
Figure 23:
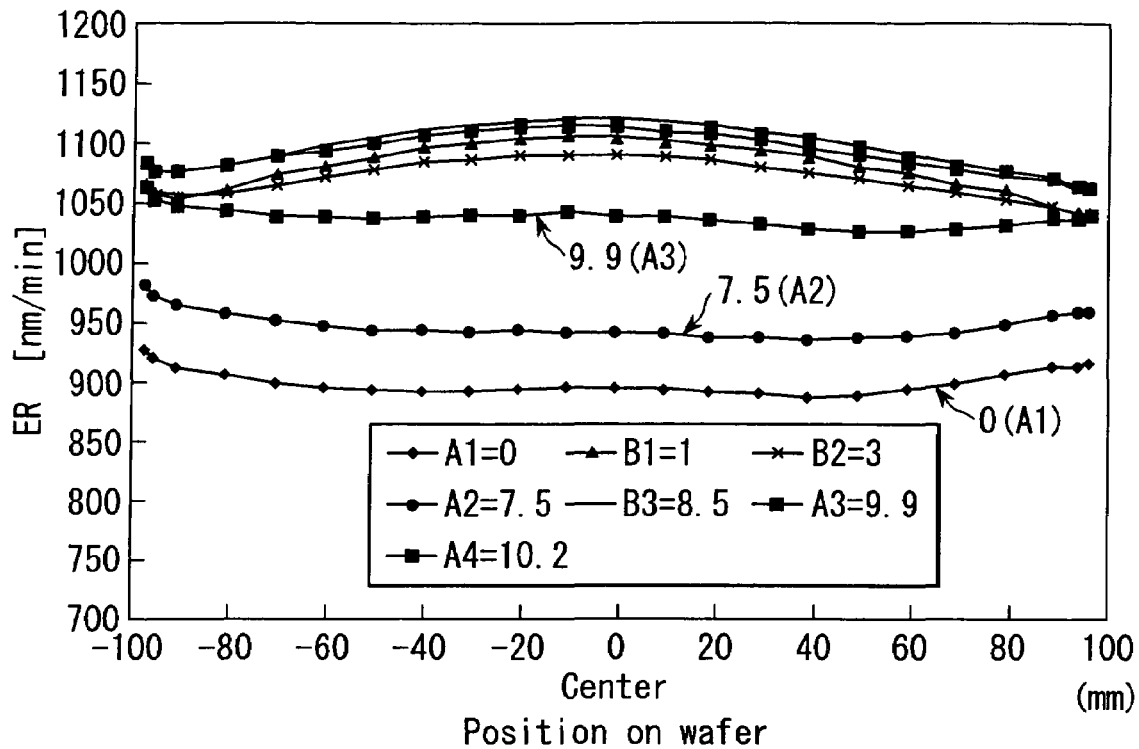
FIG. 23 is a graph showing the evaluation of the planar uniformity of the etching rate as a function of the capacitance of the variable capacitor in the apparatus shown in FIG. 18.

The capacity of the variable capacitor 86 is changed in various manners. The fluctuation states of the voltages of the harmonics including the fundamental wave, the electron density at this time in the plasma, and the etching planar uniformity are evaluated. The evaluation result will be described. FIG. 20 is a graph showing the dependency of a bottom voltage Vpp (see FIG. 18) as the voltage value of the lower electrode 18 on the capacitance (dial value DV) of the variable capacitor. FIGS. 21A to 21D are graphs showing the dependencies of the bottom voltages Vpp of the respective harmonics including the fundamental wave on the capacitance (dial value DV) of the variable capacitor. FIG. 22 is a graph showing the dependency of an electron density ED in the plasma on the capacitance (dial value DV) of the variable capacitor. FIG. 23 is a graph showing the evaluation of the planar uniformity of an etching rate ER as a function of the capacitance (dial value DV) of the variable capacitor.

In FIG. 22, the dial value DV of the variable capacitor 86 is expressed as 0 to 11. This corresponds to a capacitance change of, e.g., 250 pF to 30 pF.

As is apparent from FIG. 20, at points A1, A2, and A3 where the dial value DV was "0", "7.5", and "9.9", the bottom voltage Vpp leaped largely, and resonance occurred at these points A1 to A3. A change in voltage against the respective harmonics including the fundamental wave was measured. Although second, third, and fourth harmonics are indicated as examples, a further higher harmonic may also be considered.

Figure 21A:
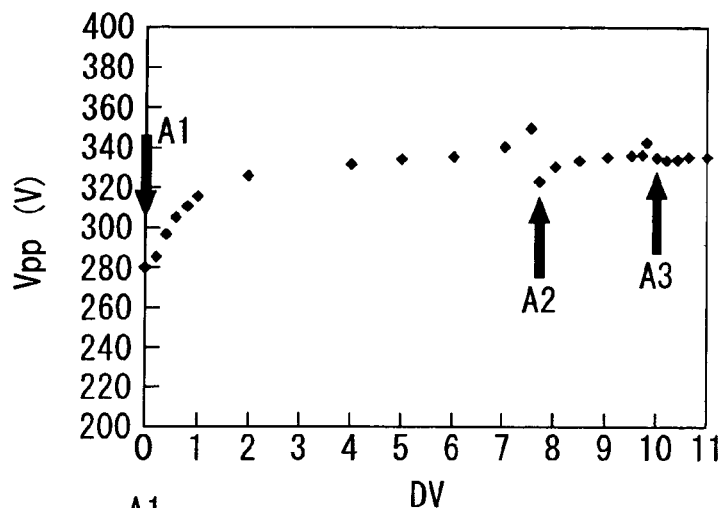
FIGS. 21A to 21D are graphs showing the dependencies of respective harmonics including a fundamental wave on the capacitance of the variable capacitor in the apparatus shown in FIG. 18.
Figure 21B:
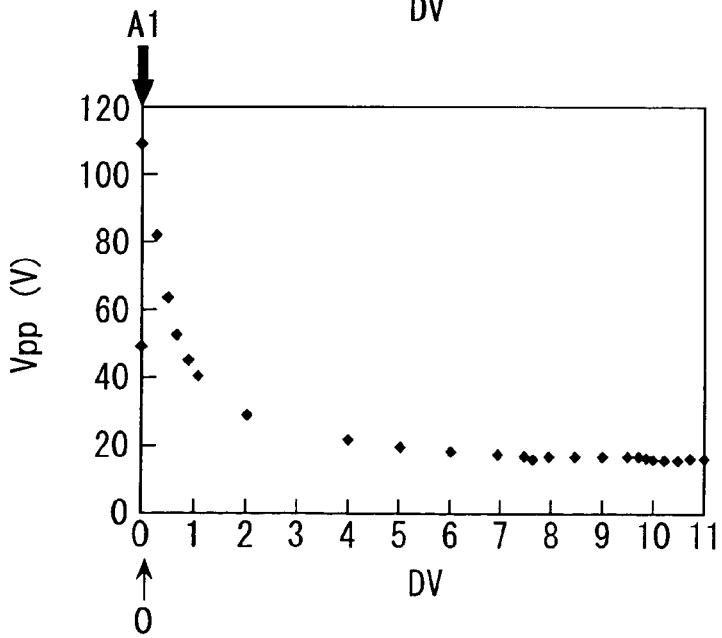
Figure 21C:
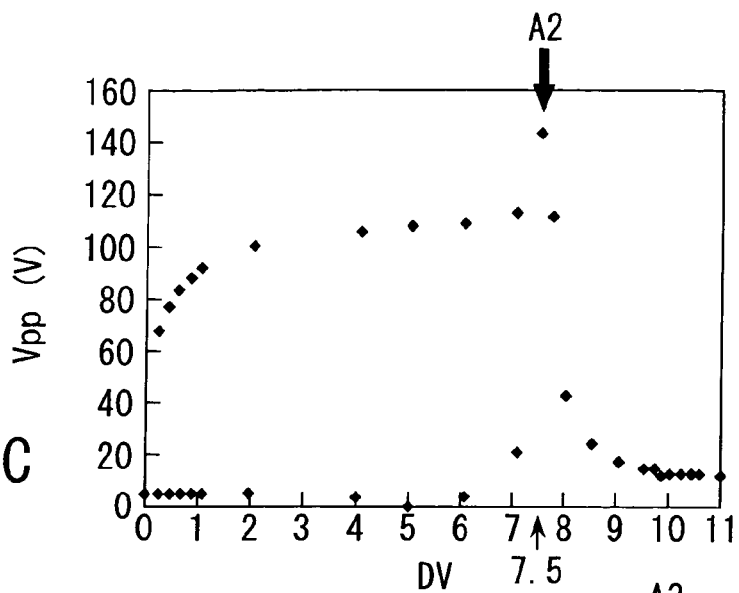
Figure 21D:
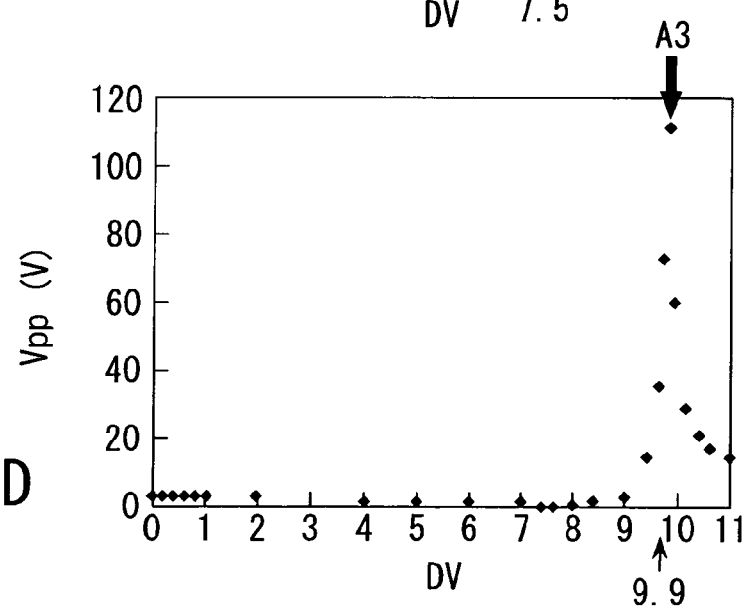

FIG. 21A shows a change in bottom voltage Vpp against the fundamental wave (13.56 MHz). The voltage temporarily decreases sharply, even if a little, at the points A1, A2, and A3. FIG. 21B shows a change in bottom voltage Vpp against a second harmonic (27.12 MHz). The voltage increases sharply at the point A1, and resonance with the second harmonic occurs when the dial value DV is "0". FIG. 21C shows a change in bottom voltage Vpp against a third harmonic (40.68 MHz). The voltage increases sharply at the point A2, and resonance with the second harmonic occurs when the dial value DV is "7.5". FIG. 21D shows a change in bottom voltage Vpp against a fourth harmonic (54.24 MHz). The voltage increases sharply at the point A3, and resonance with the second harmonic occurs when the dial value DV is "9.9".

A probe for measuring the electron density was inserted in the plasma, and the electron density ED was measured. As a result, as shown in FIG. 22, the electron density ED decreases temporarily at the points A1, A2, and A3 (dial: 0, 7.5, and 9.9). It was confirmed that the plasma state was controlled at these points.

On the basis of the above evaluation result, the silicon oxide film of the wafer was etched with various different dial values DV. The obtained etching rate ER will be described with reference to FIG. 23. A wafer having a diameter of 200 mm was used. The process conditions were as follows. As the etching gas, $CF_4$ was used. The flow rate of the etching gas was 80 sccm. The process pressure was 150 mTorr (20 Pa).

FIG. 23 shows the points A1 to A3 and points B1 to B4 corresponding to the respective dial values. The dial value was set at the points B1 to B4 that were off the resonance point, and etching was performed. As is apparent from FIG. 23, with any of these dial values, the etching rate was high at the wafer center and low at the peripheral portion. The planar uniformity of the etching rate was poor.

When, the dial value, however, was set at the respective resonance points A1 to A3, the increase in etching rate at the wafer center was suppressed, so the overall etching rate became substantially flat. The planar uniformity of the etching rate was largely improved. In this case, as the harmonic wave becomes fourth, third or second harmonic, the etching rate gradually decreased in this order. Thus, to maintain a high etching rate, it is preferable to so adjust the impedance as to resonate particularly with the fourth harmonic. When the dial value is set at the point A1, although the planar uniformity can be improved, the etching rate itself becomes excessively low.

FIG. 19 shows an example in which a series circuit of the variable capacitor 86 and fixed coil 88 is used as the impedance change unit 84. The impedance change unit 84 is not limited to this, but can be any circuit as long as it can change the impedance. For example, all the circuit configurations as shown in FIGS. 7A to 7G can be used. In this case, as described above, an impedance range that can be changed such that the impedance can resonate with a harmonic as opposed to the fundamental wave is set. As shown in FIGS. 7F and 7G, when the impedance is switched by the switches 53, the inductance of the fixed coil 40 and the capacitance of the fixed capacitor 52 are set at such values that the impedance can resonate with a specific higher harmonic as the target.

FIG. 18 shows a case where the impedance setting section 80 is provided at the RF line 24 of the second RF power supply 28. The impedance setting section 80 is not limited to this, but can be provided at any portion where the RF current flows (in other words, any portion electrically coupled with the plasma). FIGS. 24A to 24E are schematic views showing portions where a resonance impedance setting section can be connected. In FIGS. 24A to 24E, the plasma processing apparatus is schematically described, and how the resonance impedance setting section is connected is shown.

Figure 24A:
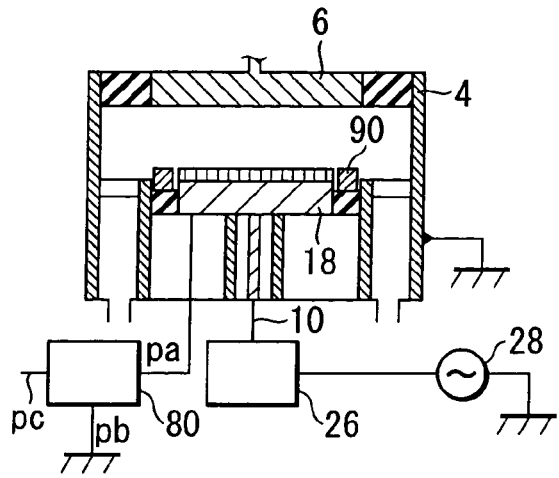
FIGS. 24A to 24E are schematic views of a plasma processing apparatus according to the seventh embodiment of the present invention, to show how a resonance impedance setting section is connected.
Figure 24D:
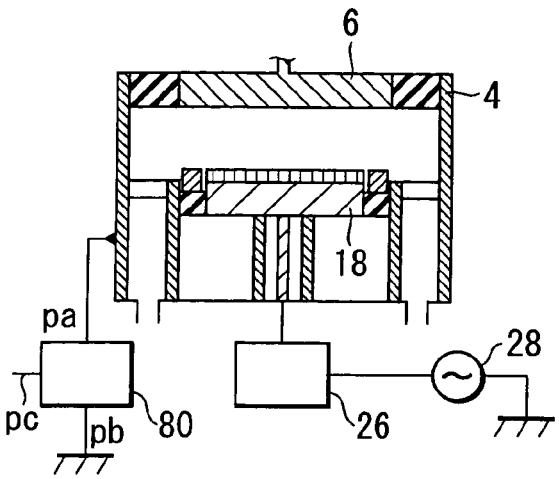
Figure 24B:
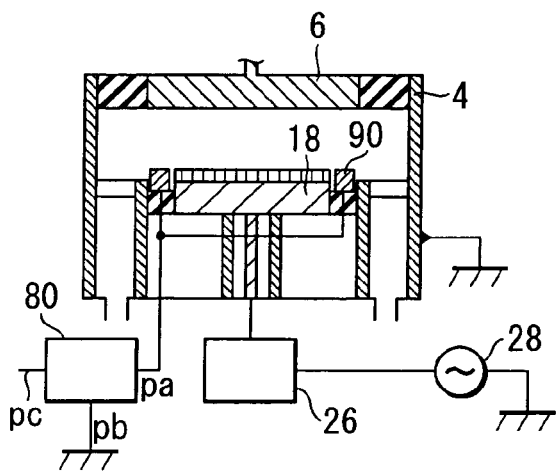
Figure 24E:
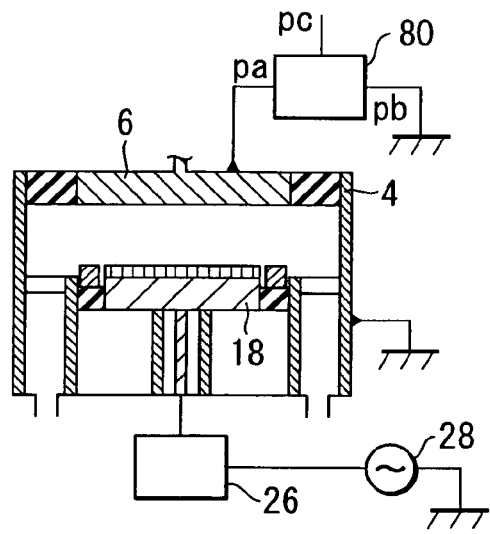
Figure 24C:
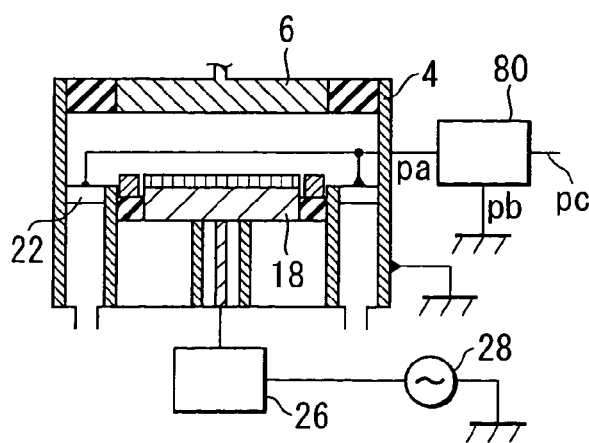

FIG. 24A shows a case where the impedance setting section 80 is connected to the lower electrode 18 by using a line different from the RF line 10. FIG. 24B shows a case where the impedance setting section 80 is connected to a focus ring 90. FIG. 24C shows a case where the impedance setting section 80 is connected to the rectifying plate 22. FIG. 24D shows a case where the impedance setting section 80 is connected to the wall (including the sidewall and bottom wall) of the process chamber 4. FIG. 24E shows a case where the impedance setting section 80 is connected to the upper electrode 6. In the case shown in FIG. 24D, the process chamber 4 is not directly grounded regarding the higher harmonics as the target, but is grounded through the impedance setting section 80. All the connection states shown in FIGS. 24A to 24E can exhibit the same operation and effect as those described with reference to FIG. 18.

Figure 26:
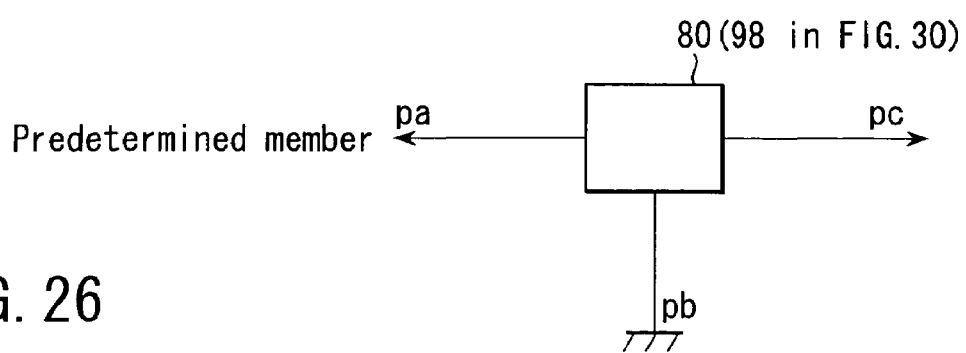
FIG. 26 is a schematic view for explaining the respective connection points of the circuit diagrams shown in FIGS. 25A to 25C.
Figures 25A, 25B, 25C:
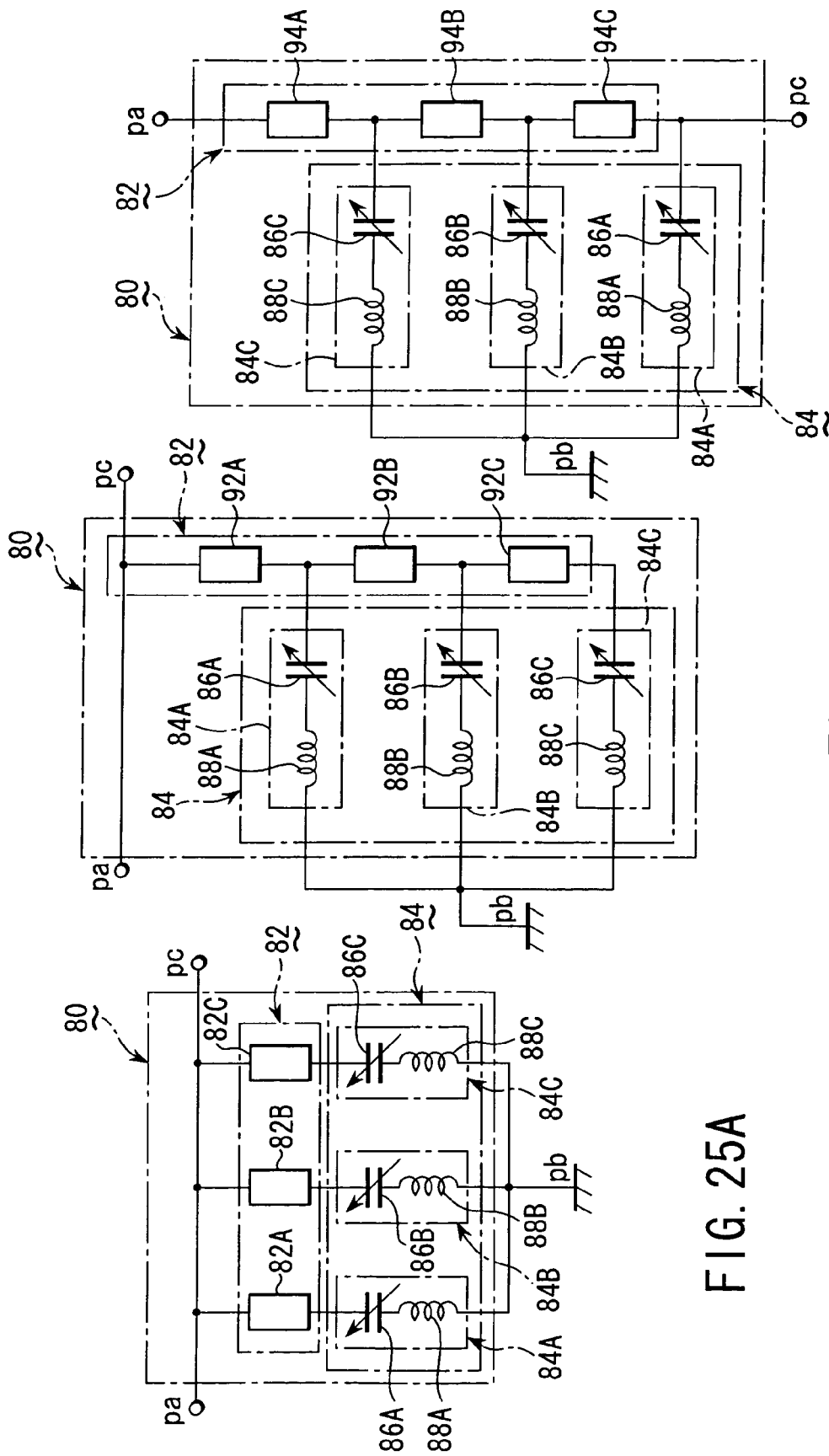
FIGS. 25A to 25C are circuit diagrams showing modifications of a resonance impedance setting section having a plurality of impedance change units according to the seventh embodiment of the present invention.

The resonance impedance setting section 80 can cope with resonance with the second to fourth harmonics by means of the impedance change unit 84 formed of one variable capacitor 86 and one fixed coil 88. Alternatively, a plurality of (three in this case) impedance change units may be provided so that the respective harmonics can be impedance-controlled independently of each other. FIGS. 25A to 25C are circuit diagrams showing modifications of the resonance impedance setting section having a plurality of impedance change units. FIG. 26 is a schematic view for explaining the respective connection points of the circuit diagrams shown in FIGS. 25A to 25C.

Symbols pa, pb, and pc indicating the three connection points of the impedance setting section 80 shown in FIG. 26 are indicated at the corresponding portions of FIGS. 24A to 24E, FIGS. 25A to 25C, and FIG. 30. The connection point pc of FIG. 26 is open or connected to a matching point when the connection point pa is connected to an electrode (see FIG. 30). The connection point pc of FIG. 26 is open when the connection point pa is connected to a member other than an electrode (see FIGS. 24A to 24E).

In the case shown in FIG. 25A, three bandpass filters 82A, 82B, and 82C for passing different harmonics are connected to the RF line 24 to be parallel to each other, to form the filter 82. In this case, the first, second, and third bandpass filters 82A, 82B, and 82C pass frequency bands respectively having the second, third, and fourth harmonics as the central frequencies. The bandpass filters 82A, 82B, and 82C do not pass the fundamental wave (13.56 MHz). Variable capacitors 86A, 86B, and 86C and fixed coils 88A, 88B, and 88C are respectively, separately connected in series to the bandpass filters 82A, 82B, and 82C. Three impedance change units 84A, 84B, and 84C are thus formed. The impedance change units 84A, 84B, and 84C are separately connected in series to the bandpass filters 82A, 82B, and 82C, respectively.

According to this arrangement, the impedance can selectively resonate with one of the three different higher harmonics. The impedance can also resonate with two or three arbitrary harmonics simultaneously. Therefore, the characteristics of the respective harmonics about the plasma process can be combined in a complex manner.

In the case shown in FIG. 25B, first, second, and third high-pass filters 92A, 92B, and 92C are connected in series in this order to form a filter 82. The first high-pass filter 92A passes any frequency equal to or higher than that of the second harmonic. The second high-pass filter 92B passes any frequency equal to or higher than that of the third harmonic. The third high-pass filter 92C passes any frequency equal to or higher than that of the fourth harmonic. An impedance change unit 84A for the second harmonic is connected between the first and second high-pass filters 92A and 92B. The impedance change unit 84A has the same arrangement as that shown in FIG. 25A. An impedance change unit 84B for the third harmonic is connected between the second and third high-pass filters 92B and 92C. An impedance change unit 84C for the fourth harmonic is connected downstream of the third high-pass filter 92C. In this case as well, the same operation and effect as those described with reference to FIG. 25A can be exhibited.

Figure 30:
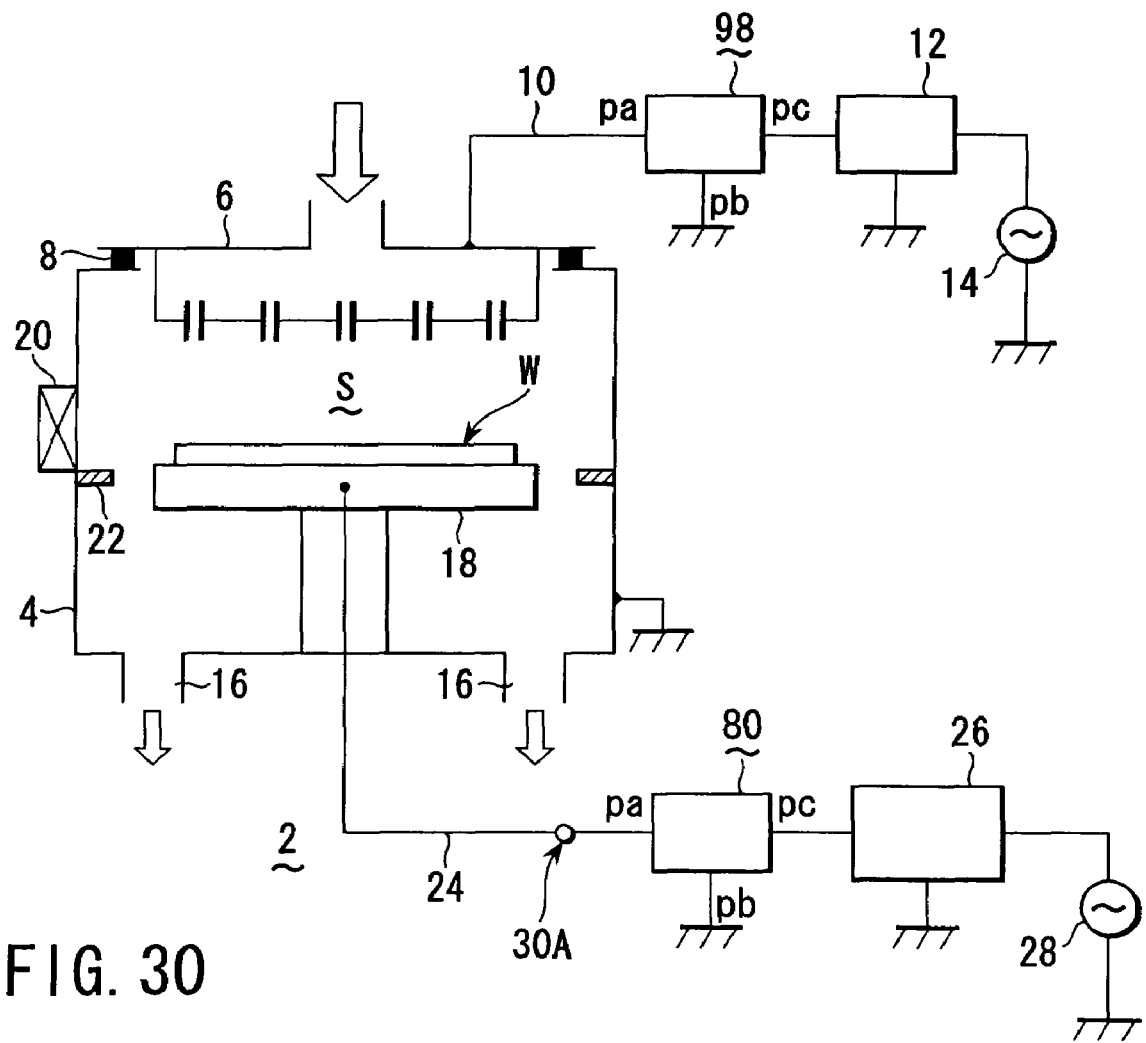
FIG. 30 is a schematic diagram showing the arrangement of a plasma processing apparatus in which RF power supplies are respectively connected to upper and lower electrodes.

The circuit configuration shown in FIG. 25C is used in a circuit configuration as shown in FIG. 30 to be described later. Accordingly, this circuit configuration is employed on the premise that the fundamental wave flows through it. Hence, this circuit configuration is not used if it is to be connected to the lower electrode 18 (see FIG. 24A), focus ring 90 (see FIG. 24B), or rectifying plate 22 (see FIG. 24C). Rather, this circuit configuration is used if it is to be connected to the process chamber 4 (see FIG. 24D) or upper electrode 6 (see FIG. 24E). This limitation does not apply when the circuit configuration is as shown in FIGS. 25A and 25B. As shown in FIG. 25C, a filter 82 is formed by connecting in series first, second, and third low-pass filters 94A, 94B, and 94C in this order. The first low-pass filter 94A passes any frequency equal to or lower than that of the fourth harmonic. The second low-pass filter 94B passes any frequency equal to or lower than that of the third harmonic. The third low-pass filter 94C passes any frequency equal to or lower than that of the second harmonic.

An impedance change unit 84C for the fourth harmonic is connected between the first and second low-pass filters 94A and 94B. The impedance change unit 84C has the same arrangement as that shown in FIG. 25A. An impedance change unit 84B for the third harmonic is connected between the second and third low-pass filters 94B and 94C. An impedance change unit 84A for the second harmonic is connected downstream of the third low-pass filter 94C. In this case as well, the same operation and effect as those described with reference to FIG. 25A can be exhibited.

The high-pass filters described in this embodiment can be formed as shown in, e.g., FIGS. 27A to 27D. FIG. 27A shows an arrangement formed of a fixed capacitor C1 and fixed resistor R1. The fixed capacitor C1 is connected in series to the circuit. The fixed resistor R1 is connected in parallel to the circuit. FIG. 27B shows an arrangement formed of a fixed capacitor C1 and fixed coil L1. The fixed capacitor C1 is connected in series to the circuit. The fixed coil L1 is connected in parallel to the circuit. FIG. 27C shows an arrangement formed of a fixed capacitor C1 and a series circuit. The fixed capacitor C1 is connected in series to the circuit. The series circuit is formed of a fixed coil L1 and fixed capacitor C2, and connected in parallel to the circuit. FIG. 27D shows an arrangement formed of a parallel circuit and a fixed coil L2. The parallel circuit is formed of a fixed capacitor C1 and fixed coil L1, and connected in series to the circuit. The fixed coil L2 is connected in parallel to the circuit.

The low-pass filters described in this embodiment can be formed as shown in, e.g., FIGS. 28A to 28D. FIG. 28A shows an arrangement formed of a fixed resistor R1 and fixed capacitor C1. The fixed resistor R1 is connected in series to the circuit. The fixed capacitor C1 is connected in parallel to the circuit. FIG. 28B shows an arrangement formed of a fixed coil L1 and fixed capacitor C1. The fixed coil L1 is connected in series to the circuit. The fixed capacitor C1 is connected in parallel to the circuit. FIG. 28C shows an arrangement formed of a fixed coil L1 and a series circuit. The fixed coil L1 is connected in series to the circuit. The series circuit is formed of a fixed capacitor C1 and fixed coil L2, and connected in parallel to the circuit. FIG. 28D shows an arrangement formed of a parallel circuit and a fixed capacitor C2. The parallel circuit is formed of a fixed coil L1 and fixed capacitor C1, and connected in series to the circuit. The fixed capacitor C2 is connected in parallel to the circuit.

Figure 29:
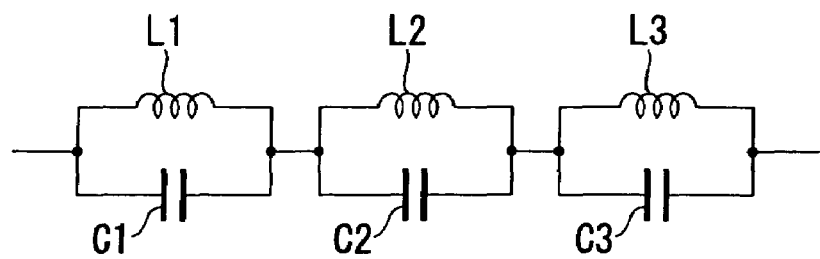
FIG. 29 is a circuit diagram showing an example of a notch filter.

FIG. 29 is a circuit diagram showing an example of a notch filter. In place of the bandpass filters 82A to 82C described above, a notch filter of this type may be used. In the notch filter, a notch that does not pass only a specific frequency band is connected in series. Thus, the notch filter passes a desired frequency band. For example, the parallel circuit of a first fixed coil L1 and first fixed capacitor C1 cuts the frequency band of the fundamental wave. The parallel circuit of a second fixed coil L2 and second fixed capacitor C2 cuts the frequency band of the second harmonic. The parallel circuit of a third fixed coil L3 and third fixed capacitor C3 cuts the frequency band of the third harmonic. When these parallel circuits are connected in series, the notch filter can pass the frequency band of the fourth harmonic (more particularly, the notch filter passes any frequency band equal to or higher than that of the fourth harmonic). Accordingly, if the inductances of the respective fixed coils and the capacitances of the respective fixed coils are appropriately set, the notch filter can cut any unwanted frequency band and passes any desired frequency band.

In the seventh embodiment, the RF power supply 28 is connected to the lower electrode 18. If an RF power supply is connected to only the upper electrode 6, the arrangement is merely reversed upside down, and the same effect as that described above can be obtained. In this case, the lower electrode 18 is set such that the RF current applied to the upper electrode 6 flows through it.

The seventh embodiment can also be applied to a case where RF power supplies 14 and 28 are respectively connected to upper and lower electrodes 6 and 18 (this is the same as in the case shown in FIG. 1), as shown in FIG. 30. In FIG. 30, a resonance impedance setting section 80 which can change the impedance set value is provided at an RF line 24 for the lower electrode 18. A resonance impedance setting section 98 which can change the impedance set value is also provided at an RF line 10 for the upper electrode 6. In this case, in the arrangement of the impedance setting section 98 of the upper electrode 6 side, the fundamental frequency is changed from 13.56 MHz to 60 MHz of the first RF power supply 14. Except for this, the arrangement previously described concerning the impedance setting section 80 of the lower electrode 18 side can entirely be applied to the arrangement of the impedance setting section 98. Alternatively, either one of the two impedance setting sections 80 and 98 may be employed.

In the seventh embodiment, each impedance change unit is set to realize a complete resonance state with a higher harmonic, or to realize a state largely off the resonance state from the higher harmonic. Alternatively, in the seventh embodiment, the plasma state may be controlled by setting an incomplete resonance state, e.g., a resonance state of about 50%. Also, the degree of the resonance state may be controlled to linearly change within the range of 0% to 100%.

The frequencies of the RF power supplies employed in the first to seventh embodiments are merely examples. For example, 800 kHz, 2 MHz, 27 MHz, 100 MHz, and the like can be used instead. Two or more of RF power supplies of different frequencies may be connected to one electrode. In this case, for example, a combination of them, such as 40 MHz and 3.2 MHz, 100 MHz and 3.2 MHz, or 40 MHz and 13.56 MHz may be used.

Furthermore, the respective embodiments can be employed when a target substrate other than a semiconductor wafer, e.g., a glass substrate, LCD substrate, or the like is to be processed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus which performs a plasma process on a target substrate by using plasma, comprising:
    an airtight process chamber which accommodates the target substrate;
    a gas supply system which supplies a process gas into the process chamber;
    an exhaust system which exhausts an interior of the process chamber and sets the interior of the process chamber to a vacuum state;
    first and second electrodes arranged in the process chamber to oppose each other, an RF field, which turns the process gas into plasma by excitation, being formed between the first and second electrodes;
    an RF power supply connected to one of the first or second electrodes through a first interconnection and configured to supply RF power;
    a matching circuit arranged between said one of the first and second electrodes and the RF power supply on the first interconnection and configured to serve to automatically perform input impedance matching relative to the RF power;
    an impedance setting section provided in addition to the matching circuit and arranged between said one of the first and second electrodes and the matching circuit on the first interconnection, the impedance setting section being configured to select a higher harmonic of a fundamental frequency of the RF power, which is input from the plasma into the first interconnection, and to set an impedance relative to the selected higher harmonic thereby causing the higher harmonic to increase by a resonance action, the impendence setting section being capable of changing the selected higher harmonic to be treated as a resonance target; and
    a controller which supplies a control signal for controlling the impedance setting section to control a characteristic of a plasma process performed in the process chamber, wherein the impedance setting section comprises:
    an impedance change unit connected to the first interconnection through a shunt and configured to select the higher harmonic as a resonance target, and
    a filter disposed on the shunt between the first interconnection and the impedance change unit and configured to cut off the fundamental frequency of the RF power.

2. The apparatus according to 1, claim wherein the controller controls the impedance setting section to set the impedance such that a planar uniformity of the plasma process on the target substrate is improved.

3. The apparatus according to 1, claim wherein the controller controls the impedance setting section to set the impedance such that the plasma stabilizes.

4. The apparatus according to 1, claim wherein the impedance change unit comprises one or both of an arrangement which continuously changes the impedance with a continuous variable element, and an arrangement which changes the impedance stepwise by switching a plurality of fixed elements.

5. The apparatus according to 1, claim wherein a value of an impedance formed by the impedance setting section against the RF power is not less than twice a value of an RF load impedance formed by the process chamber and the plasma against the RF power.

6. The apparatus according to 1 claim wherein the filter has a high impedance of not less than 5Ω against harmonics other than a selected harmonic.

7. The apparatus according to 1, claim wherein the filter comprises a filter selected from the group consisting of a high-pass filter, bandpass filter, low-pass filter, and notch filter.

8. The apparatus according to 1, claim further comprising:
    a second RF power supply connected to the other of the first and second electrodes through a second interconnection and configured to supply second RF power; and
    a second matching circuit arranged between said other of the first and second electrodes and the second RF power supply on the second interconnection and configured to serve to automatically perform input impedance matching relative to the second RF power.

9. The apparatus according to 8, claim wherein the RF power supplied by the RF power supply connected to said one of the first and second electrodes is a first RF power which has a frequency higher than that of the second RF power.

10. The apparatus according to 8, claim wherein the RF power supplied by the RF power supply connected to said one of the first and second electrodes is a first RF power which has a frequency lower than that of the second RF power.

11. The apparatus according to 1, claim wherein the impedance setting section is configured to adjust a circuit defining the impedance to resonate with at least one of higher harmonics.

* * * * *